(12) United States Patent
Chen et al.

(10) Patent No.: US 8,980,717 B2
(45) Date of Patent: Mar. 17, 2015

(54) ULTRA-HIGH VOLTAGE N-TYPE-METAL-OXIDE-SEMICONDUCTOR (UHV NMOS) DEVICE AND METHODS OF MANUFACTURING THE SAME

(71) Applicant: Macronix International Co., Ltd., Hsinchu (TW)

(72) Inventors: Chieh-Chih Chen, Hsinchu County (TW); Cheng-Chi Lin, Toucheng Township, Yilan County (TW); Chen-Yuan Lin, Taitung (TW); Shih-Chin Lien, New Taipei (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/071,768

(22) Filed: Nov. 5, 2013

(65) Prior Publication Data
US 2014/0065781 A1 Mar. 6, 2014

Related U.S. Application Data

(62) Division of application No. 13/070,819, filed on Mar. 24, 2011, now Pat. No. 8,610,209.

(51) Int. Cl.
*H01L 21/336* (2006.01)
*H01L 29/66* (2006.01)
*H01L 29/06* (2006.01)
*H01L 29/08* (2006.01)
*H01L 29/78* (2006.01)
*H01L 29/10* (2006.01)
*H01L 29/417* (2006.01)
*H01L 29/423* (2006.01)

(52) U.S. Cl.
CPC ...... *H01L 29/66477* (2013.01); *H01L 29/0634* (2013.01); *H01L 29/0646* (2013.01); *H01L 29/0653* (2013.01); *H01L 29/0692* (2013.01); *H01L 29/0878* (2013.01); *H01L 29/1083* (2013.01); *H01L 29/41758* (2013.01); *H01L 29/42368* (2013.01); *H01L 29/66659* (2013.01); *H01L 29/7835* (2013.01)
USPC .......................................... 438/279; 438/286

(58) Field of Classification Search
CPC .......................... H01L 29/6659; H01L 29/665
See application file for complete search history.

(56) References Cited

U.S. PATENT DOCUMENTS

| 2006/0065931 | A1* | 3/2006 | Lee et al. | 257/355 |
| 2010/0140700 | A1* | 6/2010 | Lee | 257/343 |
| 2012/0241861 | A1 | 9/2012 | Chen et al. | |

OTHER PUBLICATIONS

CN Office Action dated May 28, 2014.
"The influence of NBL layout and LOCOS space on component ESD and system level ESD for HV-LDMOS"; Jian-Hsing Lee, et al.; Power Semiconductor Devices & Ics, pp. 173-176, May 27-30, 2007.

* cited by examiner

*Primary Examiner* — Jack Chen
(74) *Attorney, Agent, or Firm* — McClure, Qualey & Rodack, LLP

(57) ABSTRACT

An ultra-high voltage n-type-metal-oxide-semiconductor (UHV NMOS) device with improved performance and methods of manufacturing the same are provided. The UHV NMOS includes a substrate of P-type material; a first high-voltage N-well (HVNW) region disposed in a portion of the substrate; a source and bulk p-well (PW) adjacent to one side of the first HVNW region, and the source and bulk PW comprising a source and a bulk; a gate extended from the source and bulk PW to a portion of the first HVNW region, and a drain disposed within another portion of the first HVNW region that is opposite to the gate; a P-Top layer disposed within the first HVNW region, the P-Top layer positioned between the drain and the source and bulk PW; and an n-type implant layer formed on the P-Top layer.

11 Claims, 24 Drawing Sheets

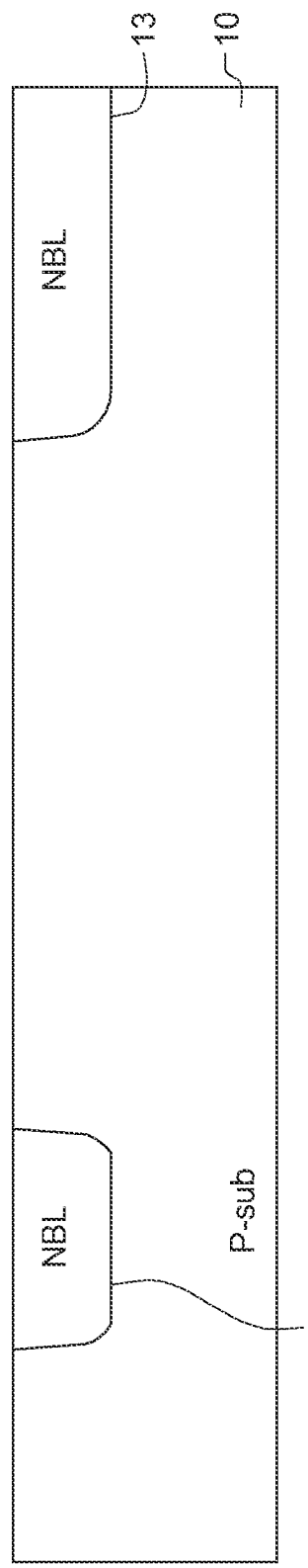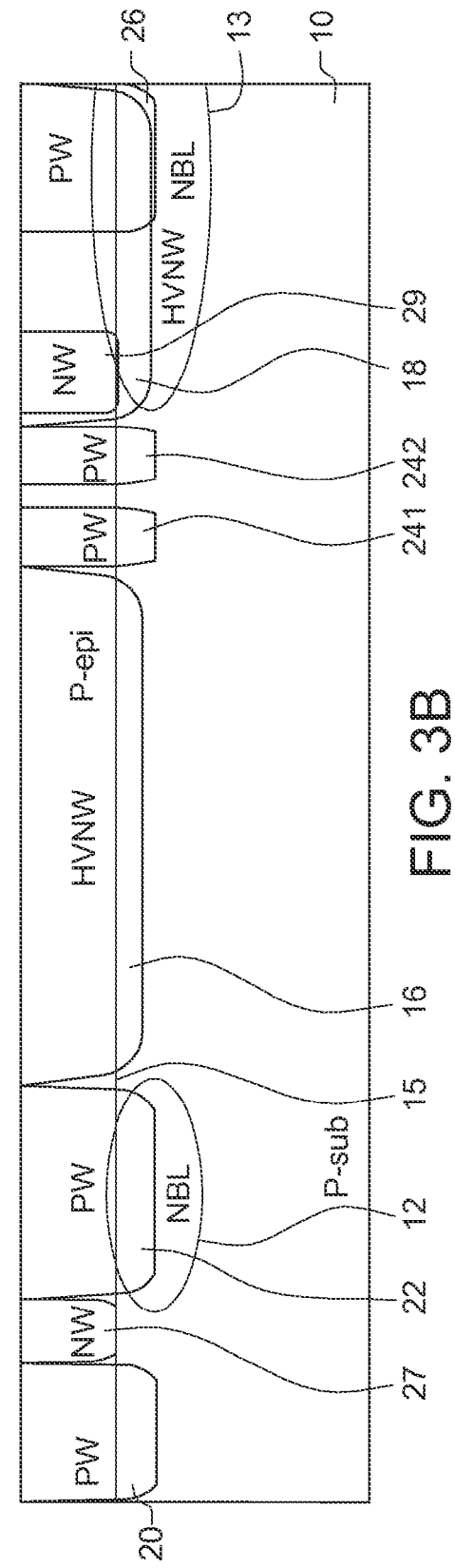
FIG. 3A
FIG. 3B

ULTRA-HIGH VOLTAGE N-TYPE-METAL-OXIDE-SEMICONDUCTOR (UHV NMOS) DEVICE AND METHODS OF MANUFACTURING THE SAME

The application is a divisional application of U.S. patent application Ser. No. 13/070,819, now U.S. Pat. No. 8,610,209, filed on Mar. 24, 2011; the subject matter of this application is incorporated herein by reference.

BACKGROUND

1. Field of the Invention

The disclosure relates in general to a semiconductor device and methods of manufacturing the same, and more particularly to an ultra-high voltage n-type-metal-oxide-semiconductor (UHV NMOS) device with improved performance and methods of manufacturing the same.

2. Description of the Related Art

There is currently an ongoing drive toward the downscaling of device dimensions in virtually all aspects of electronic device manufacture. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, many modern electronic devices require electronic circuitry to perform both actuation functions (e.g., switching devices) and data processing or other decision making functions. The use of low-voltage complementary metal-oxide-semiconductor (CMOS) technologies for these dual functions may not be practical. Thus, high-voltage integrated circuits (HVIC) or power-integrated circuits (PIC) have been developed to attempt to integrate high-voltage device structures with low voltage device structures on a single chip. There are two major challenges in HVIC: (1) to achieve a high breakdown voltage for ultra-high voltage (UHV) device; and (2) to effectively isolate between the UHV device and adjacent CMOS circuit.

Some examples of devices that involve switching at relatively high-voltage levels include drivers for flat panel displays, lighting and ballast applications (e.g., light emitting diode (LED) lighting), power supplies (e.g., mobile device chargers), and numerous other products. The high-voltage MOS devices that are desirable for employment in these applications should desirably possess a high breakdown voltage, such as to prevent punch through from a high-voltage area to a low-voltage area. Also, the semiconductor devices, for example, the N-type metal-oxide-semiconductor device suitable for ultra-high-voltage (UHV) operation, generally require good performance during operation, and could be manufactured by a low-cost and easy-to-carry-out manufacturing process.

SUMMARY

The disclosure relates to an ultra-high voltage n-type-metal-oxide-semiconductor (UHV NMOS) device and methods of manufacturing the same. The UHV NMOS device with improved performance is suitable for ultra-high-voltage operation, and can be manufactured using a low-cost and easy-to-carry-out method.

According to the first aspect of the present disclosure, an UHV NMOS device is provided, comprising a substrate of P-type material; a first high-voltage N-well (HVNW) region disposed in a portion of the substrate; a source and bulk p-well (PW) adjacent to one side of the first HVNW region, and the source and bulk PW comprising a source and a bulk; a gate extended ti from the source and bulk PW to a portion of the first HVNW region, and a drain disposed within another portion of the first HVNW region that is opposite to the gate; a P-Top layer disposed within the first HVNW region, the P-Top layer positioned between the drain and the source and bulk PW; and an n-type implant layer formed on the P-Top layer.

According to the second aspect of the present disclosure, a method for manufacturing the UHV NMOS device is provided. First, a substrate of P-type material is provided. A first high-voltage N-well (HVNW) region is formed in a portion of the substrate. A source and bulk p-well (PW) is formed adjacent to one side of the first HVNW region. Then, a P-Top layer is formed within the first HVNW region. Also, an n-type implant layer is formed on the P-Top layer.

The disclosure will become apparent from the following detailed description of the preferred but non-limiting embodiments. The following description is made with reference to the accompanying drawings.

BRIEF DESCRIPTION OF THE DRAWINGS

FIG. 3A~FIG. 3E illustrate a method of manufacturing the ultra-high voltage n-type-metal-oxide-semiconductor (UHV NMOS) device according to the first embodiment of the present disclosure.

DETAILED DESCRIPTION

Figure 1:
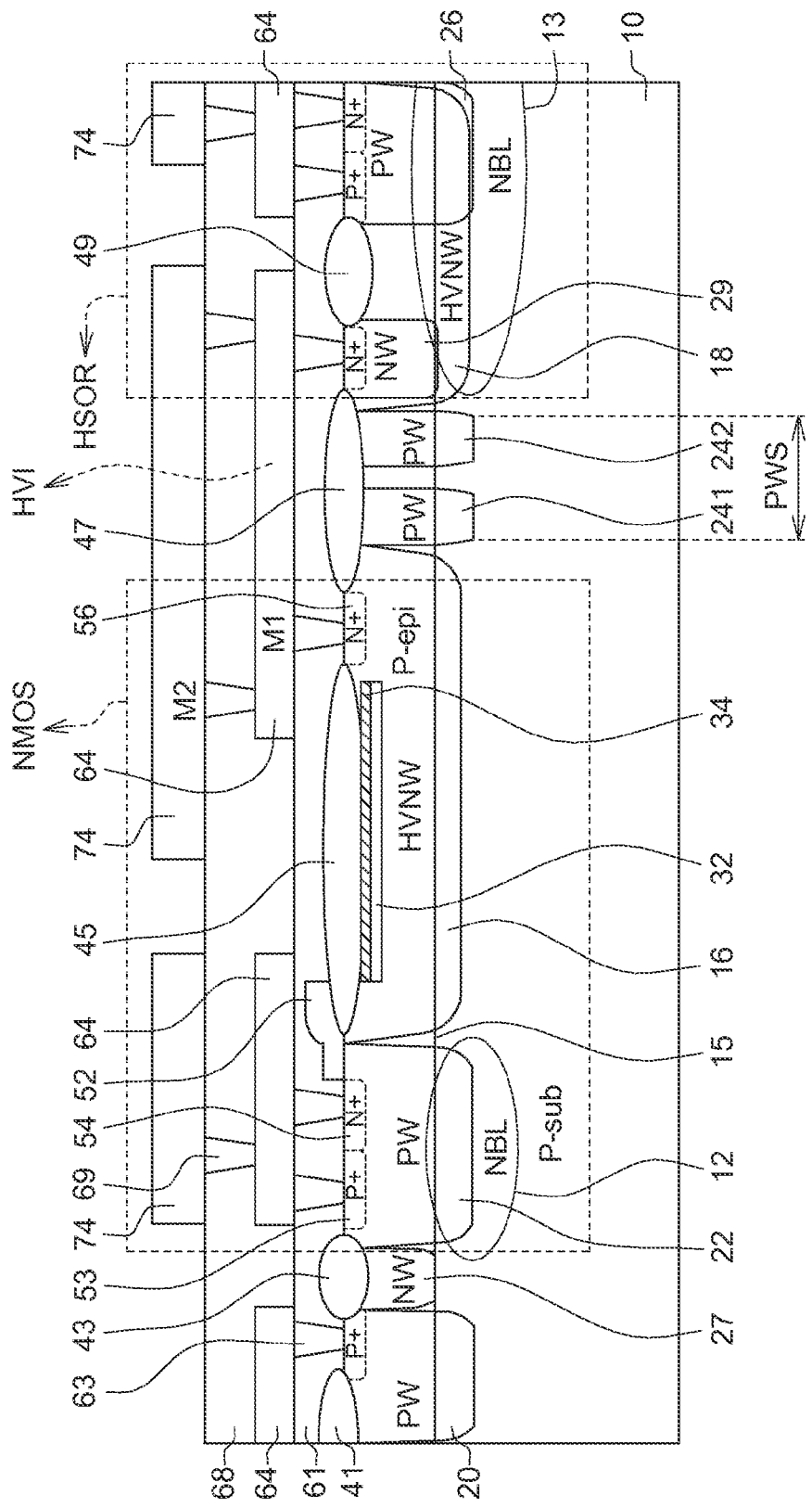
FIG. 1 shows an ultra-high voltage n-type-metal-oxide-semiconductor (UHV NMOS) device according to the first embodiment of the present disclosure.

In the embodiments of the present disclosure, an ultra-high voltage n-type-metal-oxide-semiconductor (UHV NMOS) device and method of manufacturing the same are provided. According to the present disclosure, an n-type implant layer is adopted in the device for improving the performance such as I/V curve Improvement. There are several embodiments disclosed below, with reference to the accompanying drawings, are for elaborating the possible structures of UHV NMOS devices of the disclosure, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Also, the descriptions disclosed in the embodiments of the disclosure such as detailed structure, manufacturing procedures and material selections are for illustration only, not for limiting the scope of protection of the disclosure. Also, common reference numerals are used throughout the drawings and the detailed description of the embodiments to indicate the same elements. The present embodiments of the disclosure will be more apparent from the following detailed description taken in conjunction with the accompanying drawings.

UHV NMOS Device of First Embodiment

FIG. 1 shows an ultra-high voltage n-type-metal-oxide-semiconductor (UHV NMOS) device according to the first embodiment of the present disclosure. In the first embodiment, an UHV NMOS device includes a substrate 10, such as a P-substrate. As shown in FIG. 1, the substrate 10 includes a NMOS region and a high-side operation region (HSOR). The UHV NMOS device further includes a first N-doped buried layer (NBL) 12 disposed at the NMOS region and a second NBL 13 disposed at the high-side operation region for providing isolation functionality. In the embodiment, a P-epi layer 15 could be optionally deposited over the substrate 10. The UHV NMOS device further includes a first high-voltage N-well (HVNW) region 16 disposed in a portion of the substrate 10 and a second HVNW region 18 disposed in a high-side operation region (HSOR) of the substrate 10. The first and second HVNW regions 16 and 18 may provide an increased critical electrical field for prevention of breakdown at high operating voltages (e.g., greater than 650V).

Also, the P-epi layer 15 may include several P-wells (PWs) and N-wells (NWs). As shown in FIG. 1, a PW 20, a source and bulk PW 22 adjacent to one side of the first HVNW region 16 are provided along with the NWs 27 and 29. Also, PW in a PW space (PWS) for high voltage interconnection may be split into several separate PWs, such as two PWs 241 and 242, to provide self-shielding and isolation. In the embodiment, the PW regions may further include regions having higher doping concentrations of P-type or N-type material as indicated by the P+ and N+ regions, respectively. The P+ region in the bulk and source PW 22 may correspond to a bulk 53 of the device, while the N+ region in the bulk and source PW 22 may correspond to a source 54 of the device. Meanwhile, an N+ region disposed within the first HVNW region 16 may correspond to a drain 56 of the device.

Figure 2A:
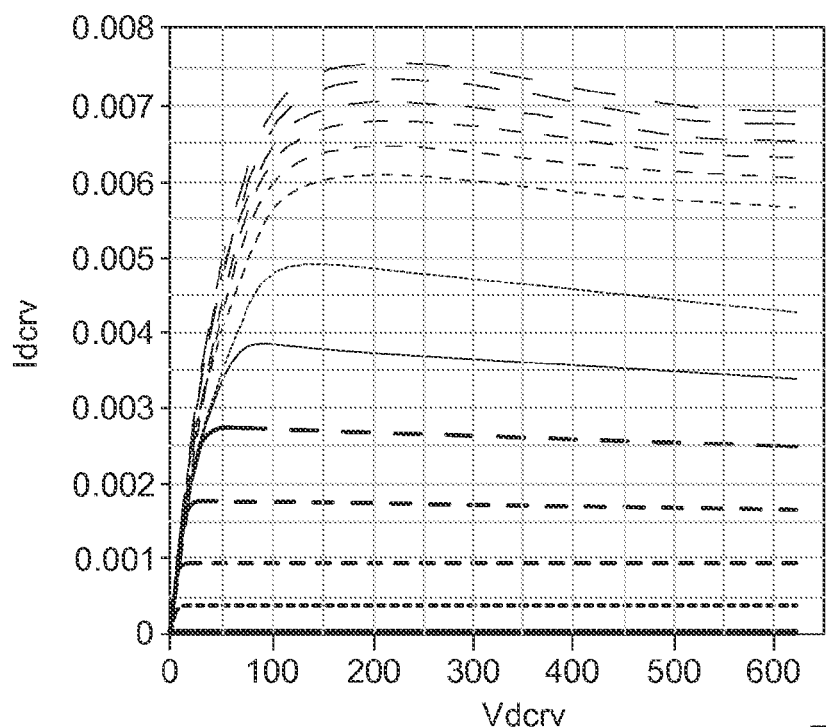
FIG. 2A shows the IN curves of the UHV NMOS devices with the n-type implant layer.
Figure 2B:
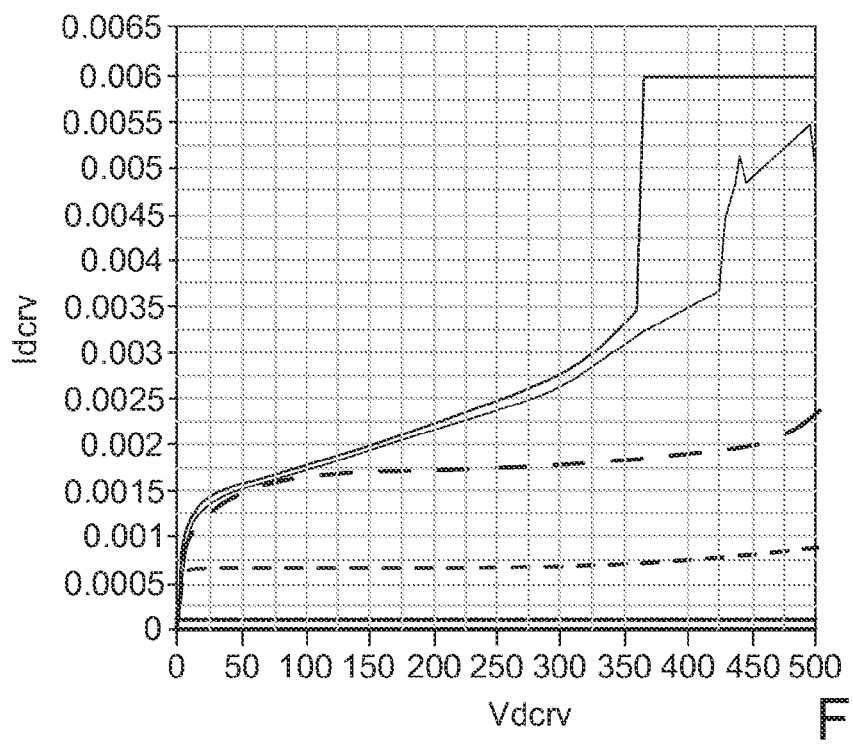
FIG. 2B shows the curves of the UHV NMOS devices without the n-type implant layer.

Further, a P-Top layer 32 is disposed within the first HVNW region 16, and positioned between the drain 56 and the source and bulk PW 22. The P-Top 32 layer may reduce surface field prior to breakdown. Also, an n-type implant layer 34 is formed on the P-Top layer 32 in the embodiment of the disclosure. Construction of the n-type implant layer 34 improves the performance of the device, such as improving I-V curve of the device. Please refer to FIG. 2A and FIG. 2B, showing the I-V curves of the UHV NMOS devices with and without the n-type implant layer 34, respectively. The UHV NMOS devices without the n-type implant layer (FIG. 2B) present the abnormal I-V curves, while the UHV NMOS devices with the n-type implant layer (FIG. 2A) present the normal I-V curves.

In the exemplified embodiment, a plurality of field oxides (FOXs) are disposed proximate to the P-epi 15 and/or any or all of the PWs, NWs and the first HVNW region 16. For example, a first FOX 41 is disposed proximate to a portion of the PW 20, and a second FOX 43 is disposed proximate to the NW 27. A third FOX 45 is disposed at the first HVNW region 16 and on the n-type implant layer 34, wherein the third FOX 45 is also positioned between the bulk and source PW 22 and the N+ region corresponding to the drain 56. A fourth FOX 47 is disposed proximate to the PWs 241 and 242 of the PW space of the high-voltage interconnection (HVI) region, and a fifth FOX 49 is disposed proximate to the second HVNW region 18 at the high side operating region (HSOR).

Also, a gate 52 could be formed between the source 54 and the third FOX 45. The drain 56 is disposed within another portion of the first HVNW region 16 that is opposite to the gate 52. The gate 52 is extended from the source 54 at the source and bulk PW 22 to a portion of the first HVNW region 16, such as extended to a portion of the third FOX 45. A region of the device extending between the edge of the bulk and the edge of the drain 56 may define a UHV NMOS. The high-voltage interconnection (HVI) region may provide interconnection between the UHV NMOS and other components on the same substrate of a lateral HVIC or PIC defined by the device of FIG. 1.

In the exemplified embodiment, an insulating layer, such as an inter-layer dielectric (ILD) layer 61, is formed on the substrate 10 and deposited over the FOXs (41, 43, 45, 47 and 49), and the PWs (20, 22, 241, 242 and 26) and NWs (27 and 29) or portions of the P-epi 15 that may be exposed. Also, a metallic layer, such as a first patterned metal layer 64, is disposed on the ILD layer 61 for use of the connection of the UHV NMOS to various other components. Several contacts 63 are formed in the ILD layer 61 for providing the connection between the first patterned metal layer 64 and the P+/N+ regions. In some cases, the metallic layer may pass over the high-voltage interconnection (HVI) region to provide interconnection between UHV device and adjacent components. As shown in FIG. 1, a portion of the first patterned metal layer 64 overpasses the PW space (PWS) for high-voltage interconnection. In some exemplified embodiments, another insulating layer, such as an inter-metal dielectric (IMD) layer 68, is formed on the first patterned metal layer 64, and a second patterned metal layer 74 is disposed on the IMD layer 68. Several vias 69 are formed in the IMD layer 68 for providing the electrical connection between the first and second patterned metal layers 64 and 74. In some cases, a portion of the second patterned metal layer also overpasses the PW space (PWS) for high-voltage interconnection, as shown in FIG. 1.

Method of Manufacturing UHV NMOS Device of First Embodiment

FIG. 3A~FIG. 3E illustrate a method of manufacturing the ultra-high voltage n-type-metal-oxide-semiconductor (UHV NMOS) device according to the first embodiment of the present disclosure.

As shown in FIG. 3A, a substrate 10 (such as a P-substrate) initially is provided, and a first NBL 12 and a second NBL 13 are formed in the substrate 10, via such as photolithography and implantation processes. In some instances, forming the first NBL 12 and the second NBL 13 may be completed with a drive in process.

As shown in FIG. 3B, a P-epi layer 15 could be deposited over the substrate 10, such as epitaxially grown over the substrate 10. A first HVNW region 16 and a second HVNW region 18 are formed in the portions of the substrate 10, via photolithography and implantation processes. The first HVNW region 16 formed in a portion of the substrate 10 spaced apart from the first NBL 12. The second HVNW region 18 formed in a portion of the substrate 10 is adjacent to the second NBL 13. Following photolithography and implantation processes used to provide various PWs through the P-epi layer 15, a drive in operation could be used with respect to the first HVNW region 16 and the second HVNW region 18. The NWs 27 and 29 may also be provided in the P-epi layer 15 via photolithography and implantation processes followed by a drive in operation.

As shown in FIG. 3B, the PWs that are provided in the P-epi layer 15 may include a PW 20, a source and bulk PW 22 adjacent to one side of the first HVNW region 16, the PWs 241 and 242 spaced apart from each other and disposed between the first and second HVNW regions 16 and 18. The PWs 241 and 242 may provide self-shielding and isolation in a high-voltage interconnection region of the device.

Figure 3C:
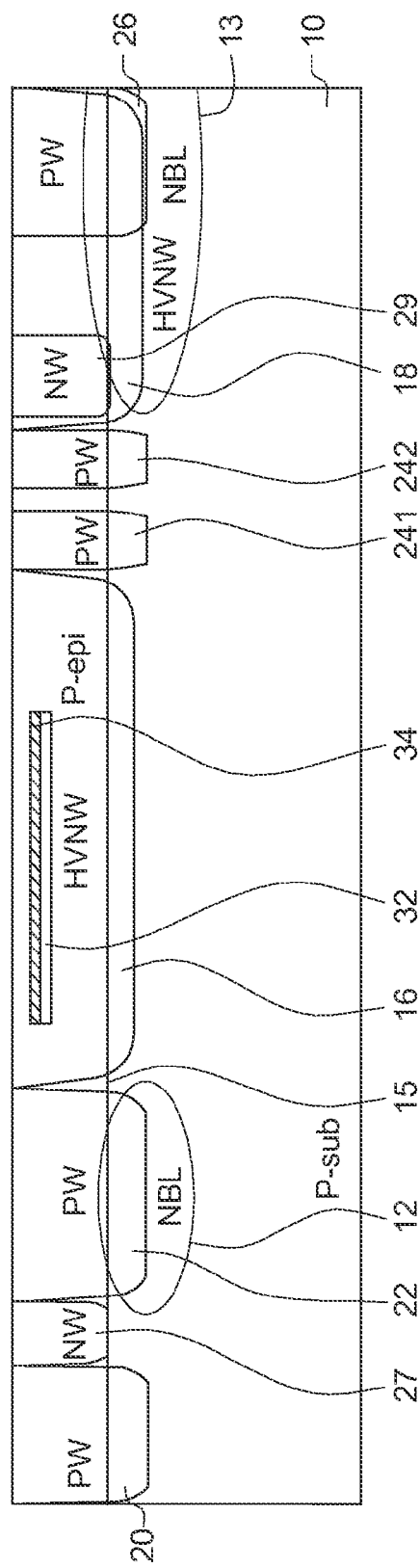

Afterwards, a P-Top layer 32 is formed within the first HVNW region 16, and an n-type implant layer 34 is formed on the P-Top layer 32 (by the conversion or deposition), as shown in FIG. 3C. The n-type implant layer 34 may be formed via photolithography and followed by an implantation or doping processes. In the first embodiment, the implanting/doping concentration of the n-type implant layer 34 is in a range of 1e11 1/cm$^2$~9e14 1/cm$^2$, while the depth of the n-type implant layer 34 is 0.1 μm~3 μm. The P-Top 32 layer may reduce surface field for charge balance prior to breakdown. The n-type implant layer 34 improves the performance of the device, such as improving I-V curve of the device. In the embodiment, the P-Top layer 32 and the n-type implant layer 34 could be formed using one photo mask, which is cost saving and time saving. In an embodiment, the n-type implant layer 34 and the P-Top layer beneath 32 substantially have the same dimension.

Figure 3D:
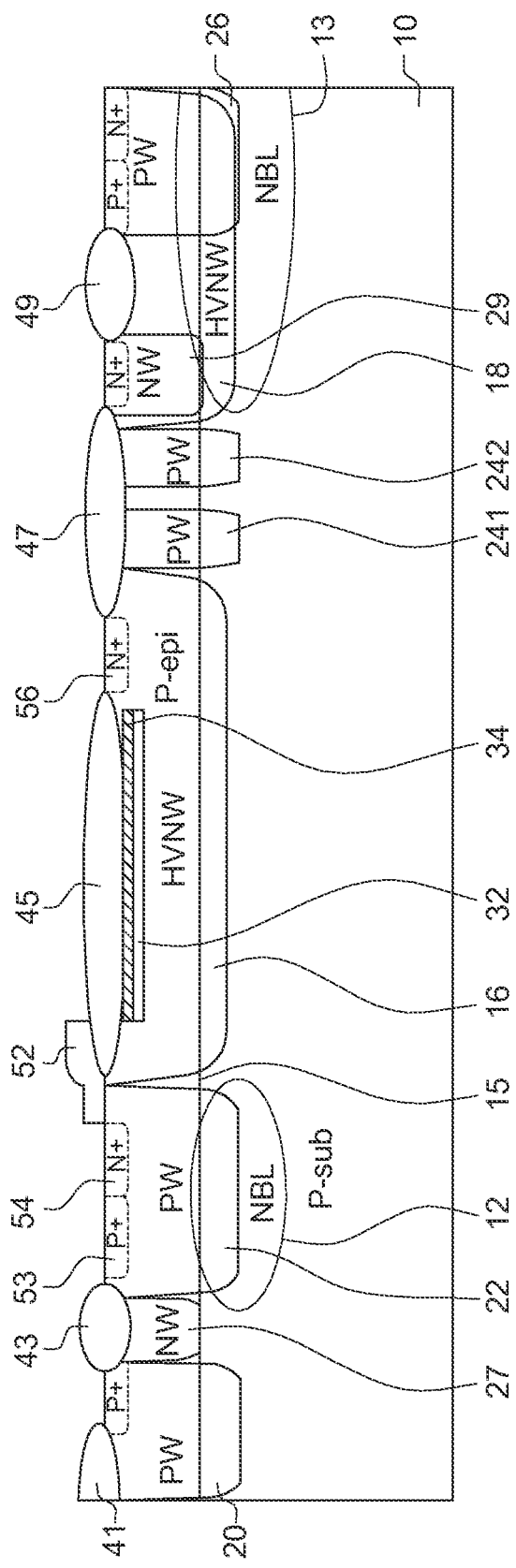

As shown in FIG. 3D, a plurality of FOX films may be grown at locations corresponding to various ones of the regions described above. The FOX (eg. 41~49) may be grown at their respective locations while employing photolithography techniques. In the exemplified embodiment, a first FOX 41 is disposed proximate to a portion of the PW 20, a second FOX 43 is disposed proximate to the NW 27, a third FOX 45 disposed at the first HVNW region 16 and on the n-type implant layer 34, a fourth FOX 47 is disposed proximate to the PWs 241 and 242 of the PW space, and a fifth FOX 49 disposed proximate to the second HVNW region 18. Then, a polysilicon layer is deposited over the top of the exposed portions and then all but a portion of the polysilicon layer that extends from the hulk and source PW 22 to the third FOX 45 is removed via photolithography techniques in order to form a gate 52. Afterwards, N-type and P-type dopants of different concentrations are introduced into various portions of the PWs 20 and 26, the bulk and source PW 22, the first HVNW region 16 and the NW 29 by photolithography techniques and implantation. For example, the bulk and source PW 22 may have P-doped and N-doped regions formed therein to define a bulk 53 and a source 54, respectively. Also, an N-doped region formed at the exposed portion of the first HVNW region 16 that is between the third FOX 45 and the fourth FOX 47 is defined as a drain 56. Thus, the gate 52 is formed between the source 54 and the third FOX 45, and extended from the source 54 at the source and bulk PW 22 to a portion of the first HVNW region 16, such as extended to a portion of the third FOX 45. The region of the device extending between the edge of the bulk and the edge of the drain 56 may define a UHV NMOS.

Figure 3E:
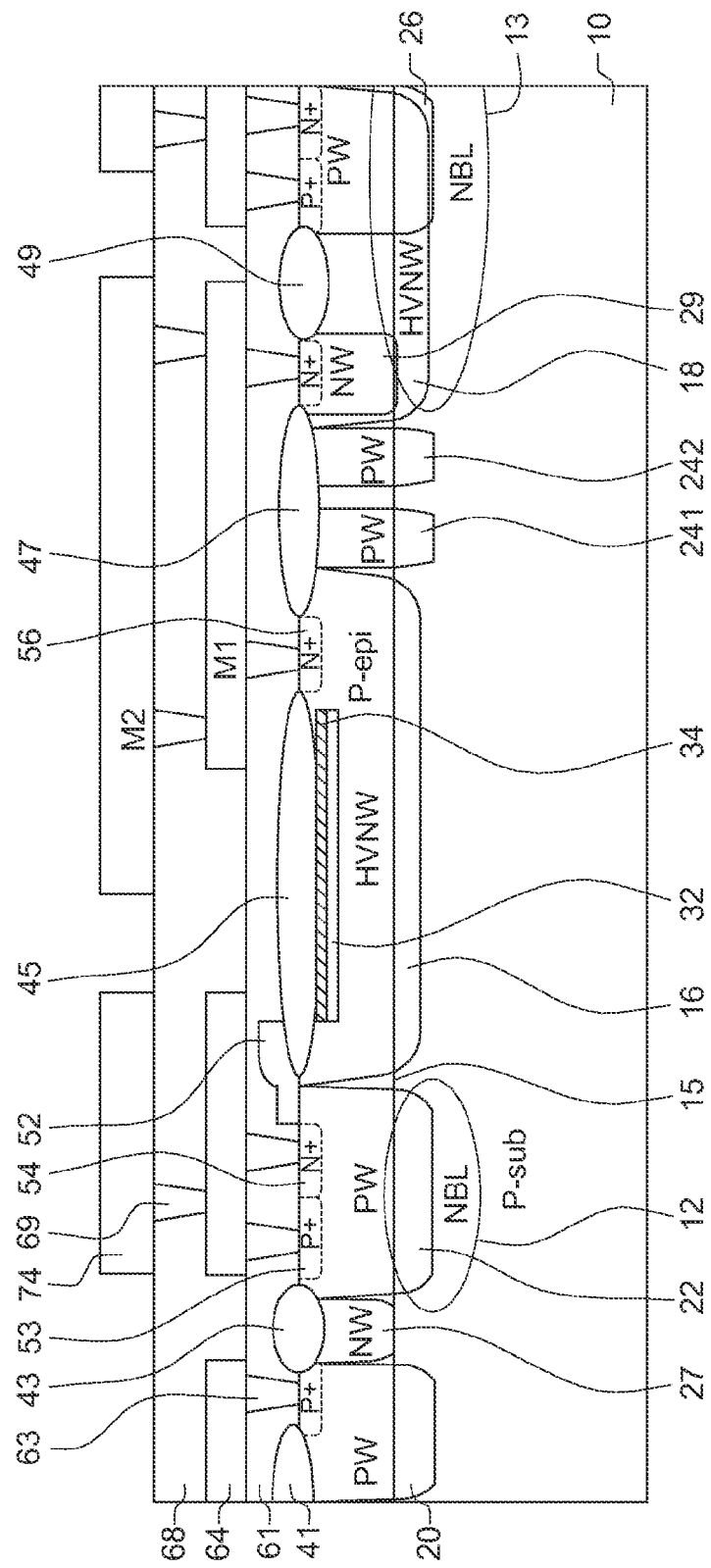

As shown in FIG. 3E, an insulating layer, such as an inter-layer dielectric (ILD) layer 61, is deposited over the FOXs (41, 43, 45, 47 and 49), and the PWs (20, 22, 241, 242 and 26) and NWs (27 and 29) or portions of the P-epi 15 that may be exposed. Contacts 63 are included in the ILD layer 61 corresponding to the bulk 53, the source 54, the drain 56 and various other components. Then, a first metal layer is formed and portions of the first metallic layer are removed using photolithography techniques to form a first patterned metal layer 64 as interconnect lines where desired.

Thereafter, an inter-metal dielectric (IMD) layer 68, with vias 69 provided in the appropriate positions, is formed on the first patterned metal layer 64. Another metallic layer may then be formed over the IMD layer 68, and portions of the metallic layer may be removed using photolithography techniques to form a second patterned metal layer 74 as interconnect lines where desired. In the first embodiment, the portions of the first and second patterned metal layers 64 and 74 overpass the PW space (PWS) for high-voltage interconnection, as shown in FIG. 3E.

Device Layout

Figure 4A:
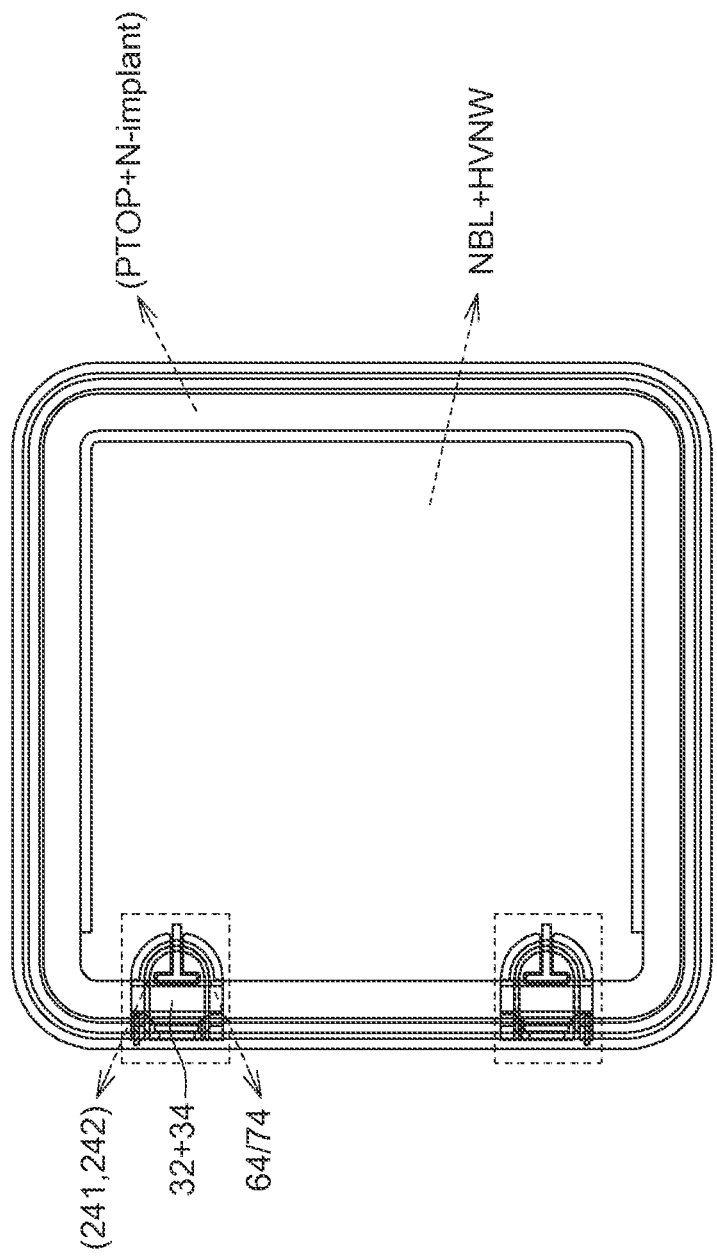
FIG. 4A is a top view of a device having the ultra-high voltage n-type-metal-oxide-semiconductors (UHV NMOSs) of the embodiment of the present disclosure.
Figure 4B:
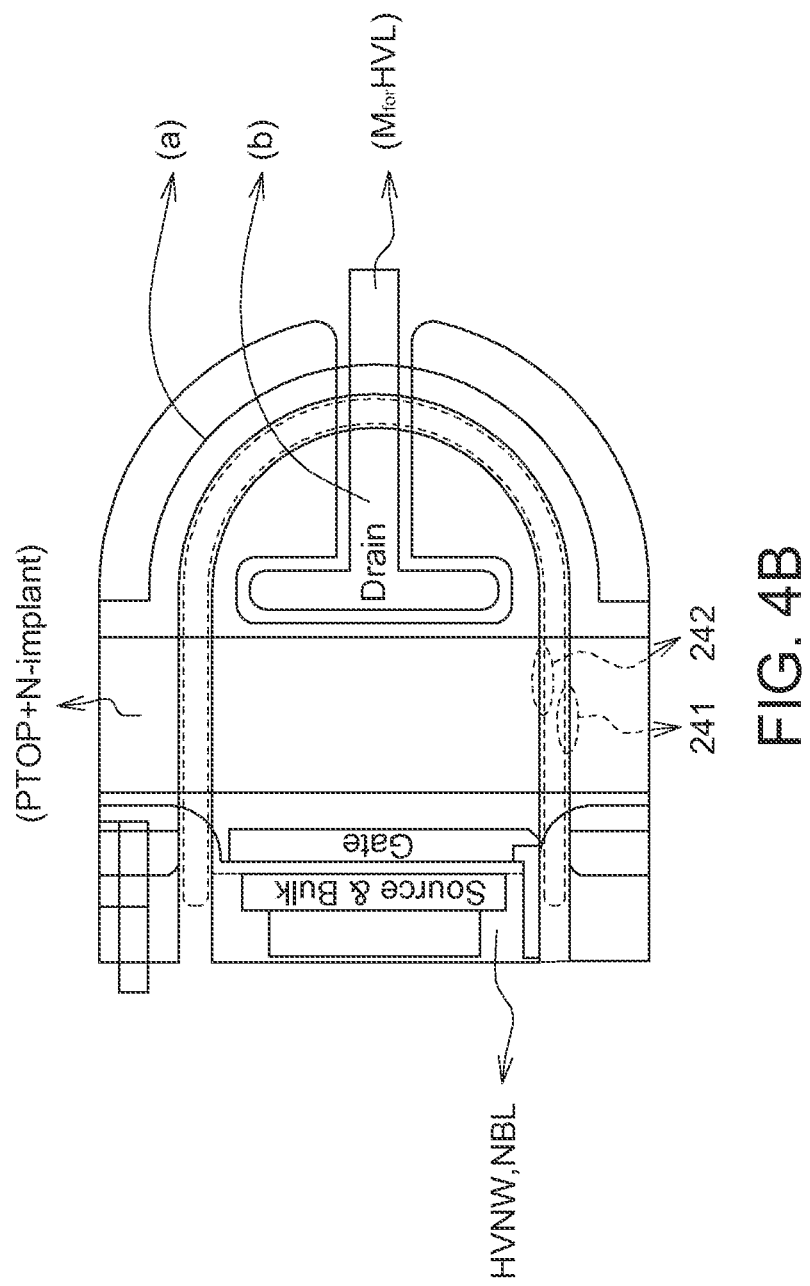
FIG. 4B is part of the enlarged view of a UHV NMOS of FIG. 4A.

FIG. 4A is a top view of a device having the ultra-high voltage n-type-metal-oxide-semiconductors (UHV NMOSs) of the embodiment of the present disclosure. FIG. 4B is part of the enlarged view of a UHV NMOS of FIG. 4A. As shown in FIG. 4A, the device may have two UHV NMOSs, but the operation voltages applied to two UHV NMOSs could be different. Other components (not shown) such as LVMOS, BJT, capacitor, resistance etc. could be set at the high voltage operation region (e.g. >650V). The positions and shapes of the metal (ex: the first patterned metal layer 64 or the second patterned metal layer 74) including the bulk 53, the source 54 and the drain 56 are shown in FIG. 4B. Also, formation of the P-Top layer 32 and the n-type implant layer 34 using the same photo mask are also shown in FIG. 4B. Also, the PWs 241 and 242 spaced apart from each other for providing self-shielding and isolation in the high-voltage interconnection region of the device are also shown in FIG. 4B. Further, the metallic piece (b) of the drain is constructed as a T-shape, and different potentials could be applied to the metallic pieces (a) and (b). Also, the elongated portion of the drain (FIG. 4B) serves as the metal for high-voltage interconnection (M for HVI), and could be electrically connected to other components such as LVMOS, BJT, capacitor, resistance . . . set in the device of FIG. 4A.

UHV NMOS Device of Second Embodiment

Figure 5:
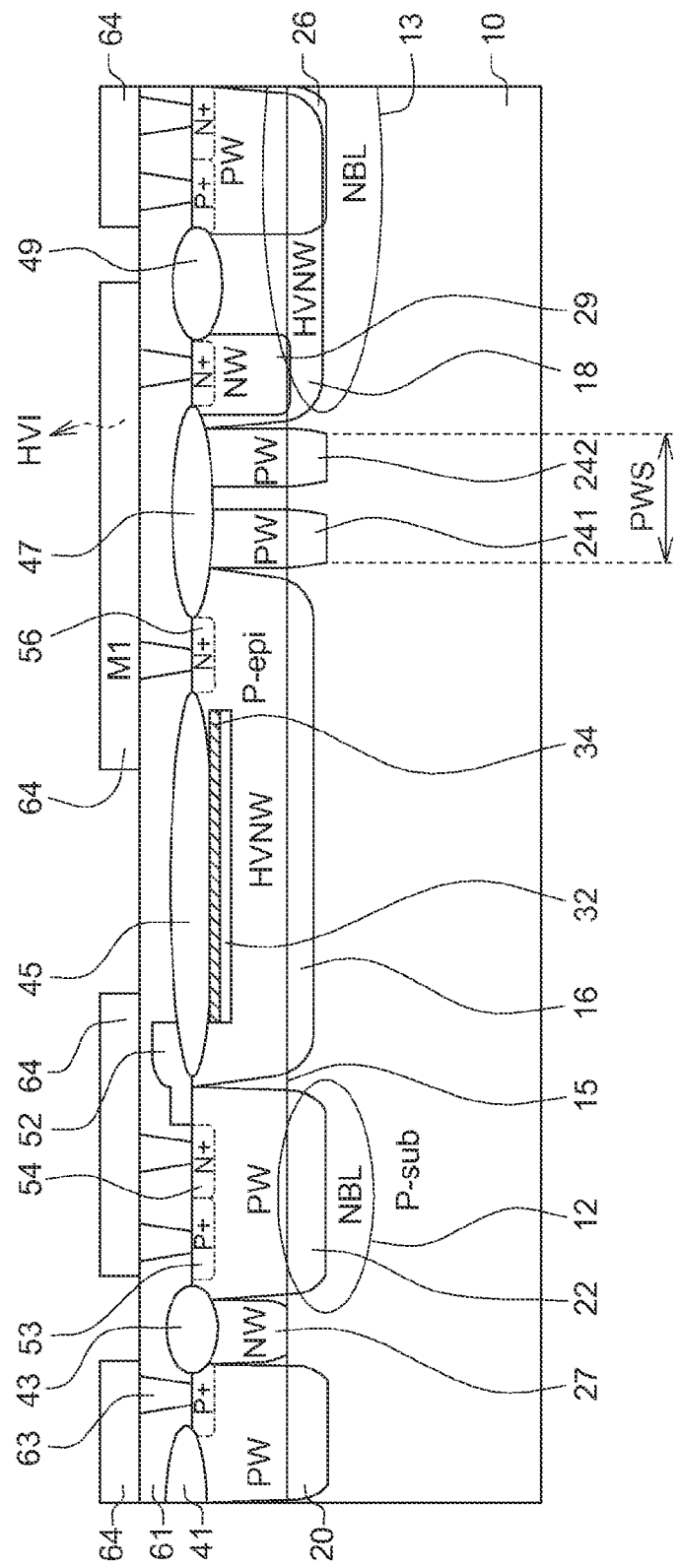
FIG. 5 shows an ultra-high voltage n-type-metal-oxide-semiconductor (UHV NMOS) device according to the second embodiment of the present disclosure.

FIG. 5 shows an ultra-high voltage n-type-metal-oxide-semiconductor (UHV NMOS) device according to the second embodiment of the present disclosure. In the second embodiment, the device may include one metallic layer instead of two. Please refer to FIG. 1 and FIG. 5 together. The devices of FIG. 5 and FIG. 1 are identical, except two metallic layers of FIG. 1 is reduced to one metallic layer (i.e. the first patterned metal layers 64) of FIG. 5.

UHV NMOS Device of Third Embodiment

Figure 6:
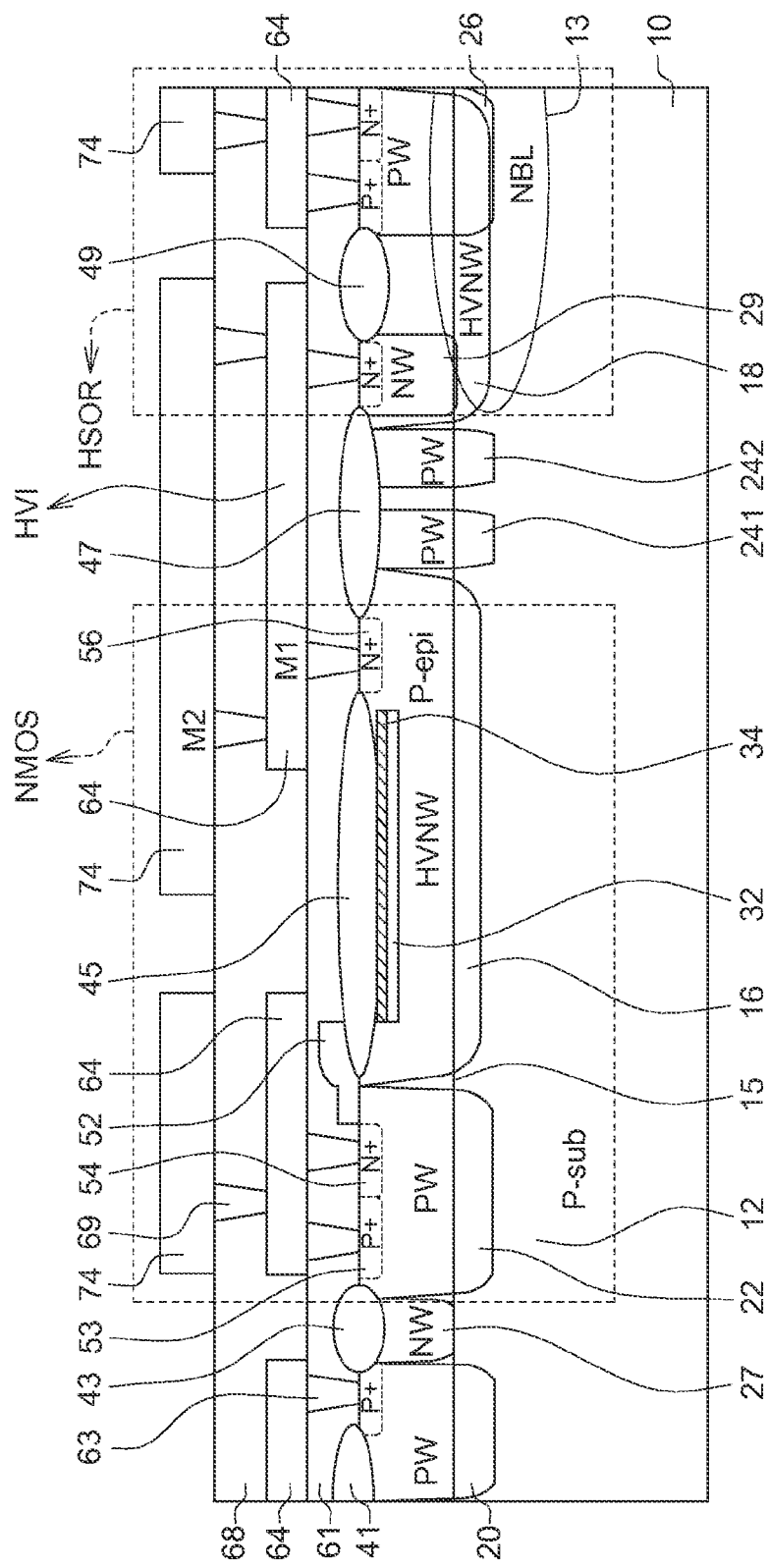
FIG. 6 shows an ultra-high voltage n-type-metal-oxide-semiconductor (UHV NMOS) device according to the third embodiment of the present disclosure.

FIG. 6 shows an ultra-high voltage n-type-metal-oxide-semiconductor (UHV NMOS) device according to the third embodiment of the present disclosure. In the third embodiment, the N-doped buried layer (NBL) of the device could be optionally removed in order to provide different applications. Please refer to FIG. 1 and FIG. 6 together. The devices of FIG. 6 and FIG. 1 are identical, except the first NBL 12 at the source side of FIG. 1 is removed, and not shown in the device of FIG. 6.

UHV NMOS Device of Fourth Embodiment

Figure 7:
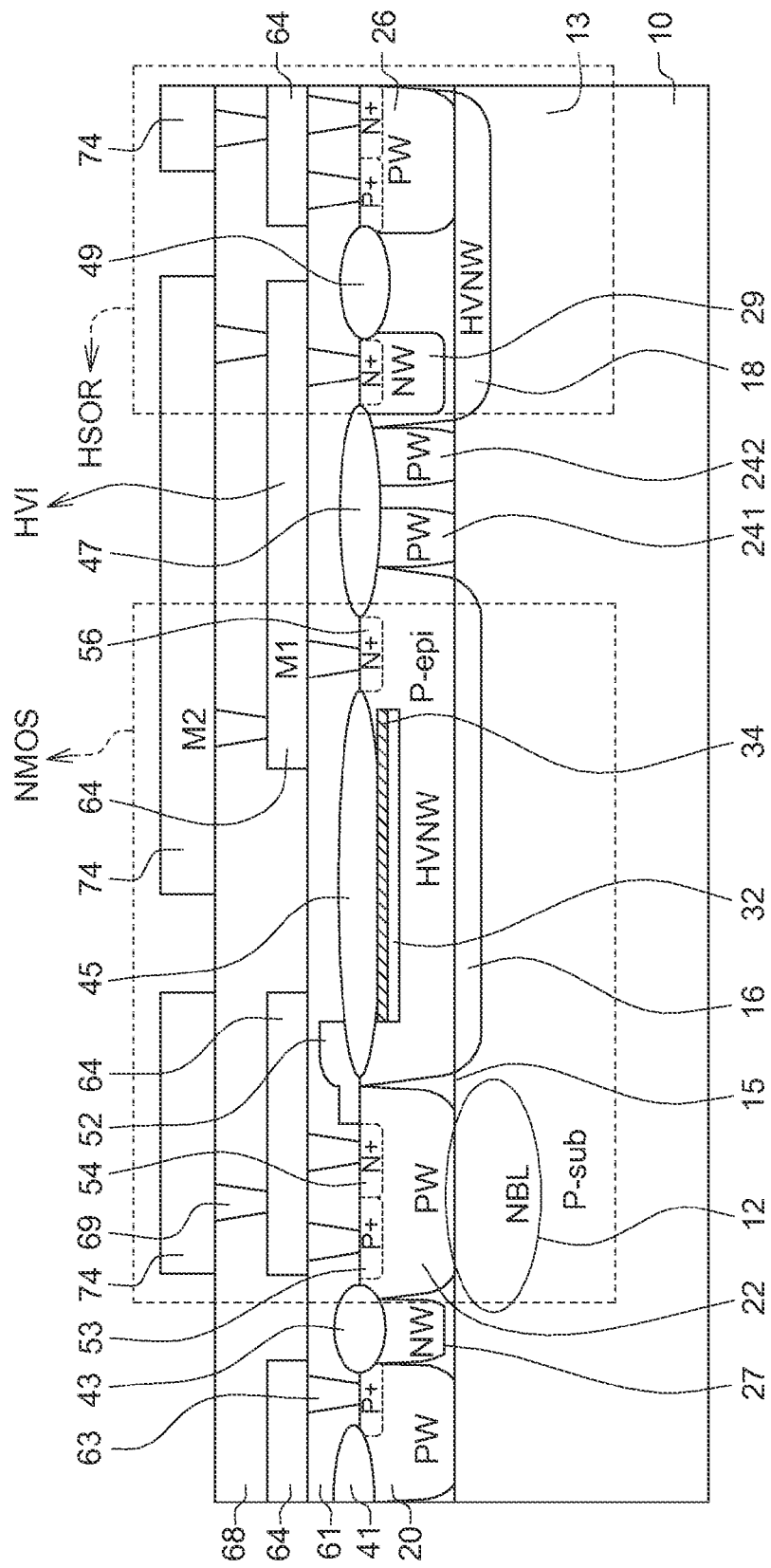
FIG. 7 shows an ultra-high voltage n-type-metal-oxide-semiconductor (UHV NMOS) device according to the fourth embodiment of the present disclosure.

FIG. 7 shows an ultra-high voltage n-type-metal-oxide-semiconductor (UHV NMOS) device according to the fourth embodiment of the present disclosure. Please refer to FIG. 1 and FIG. 7 together. Similarly, the devices of FIG. 7 and FIG. 1 are identical, except the second NBL 13 at the high side operating region (HSOR) of FIG. 1 is removed while the isolation for high side is adequate, and not shown in the device of FIG. 7.

UHV NMOS Device of Fifth Embodiment

Figure 8:
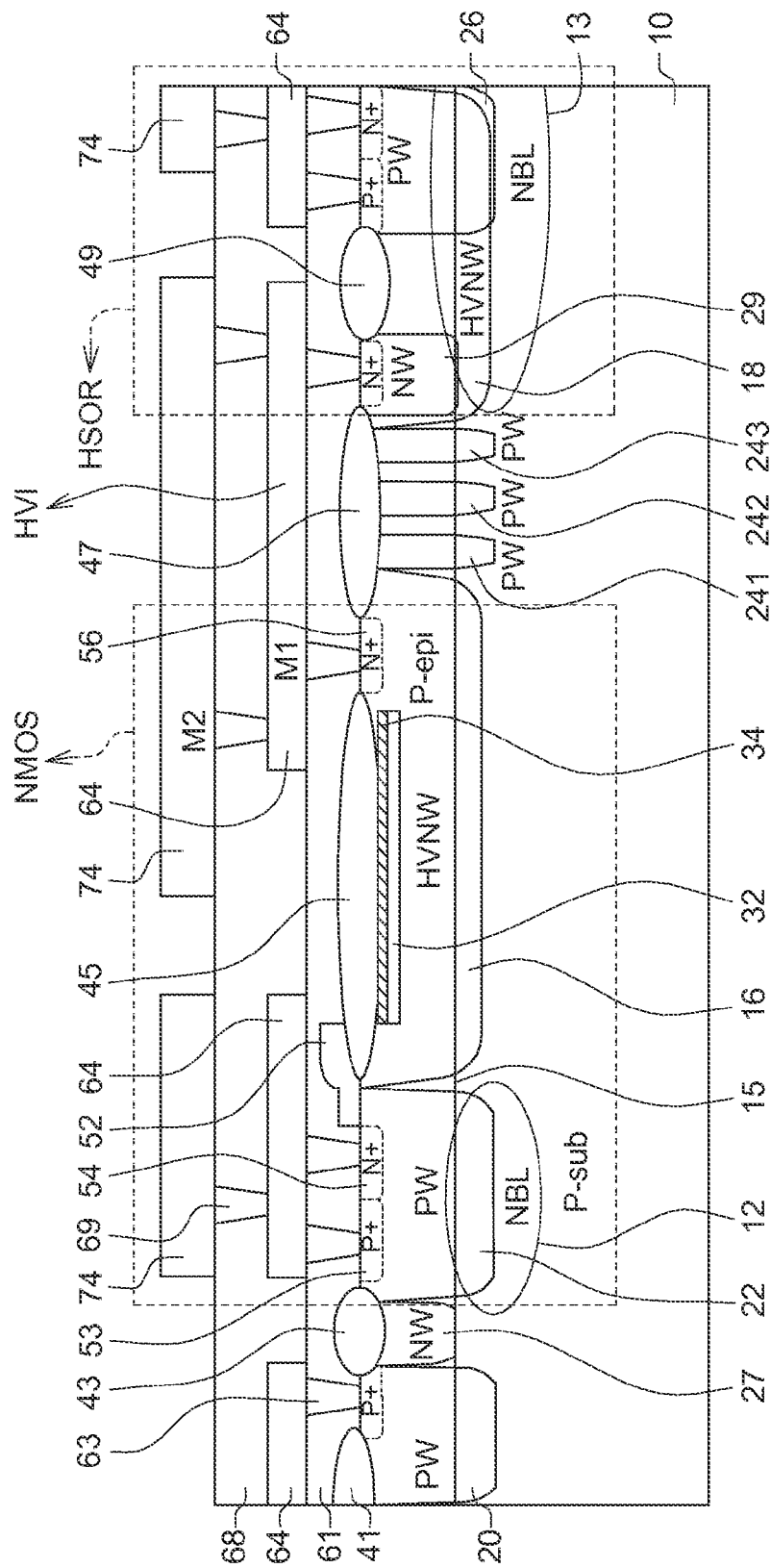
FIG. 8 shows an ultra-high voltage n-type-metal-oxide-semiconductor (UHV NMOS) device according to the fifth embodiment of the present disclosure.

FIG. 8 shows an ultra-high voltage n-type-metal-oxide-semiconductor (UHV NMOS) device according to the fifth embodiment of the present disclosure. In the first embodiment, the PW space (PWS) includes two separated PWs 241 and 242. However, the disclosure is not limited thereto. In the fifth embodiment, the PW space (PWS) for high voltage interconnection may include N of P-wells, and N is a positive integer. As shown in FIG. 8, the PW space (PWS) for high voltage interconnection includes three P-wells 241, 242 and 243 spaced apart from each other, to provide self-shielding and isolation.

UHV NMOS Device of Sixth Embodiment

Figure 9:
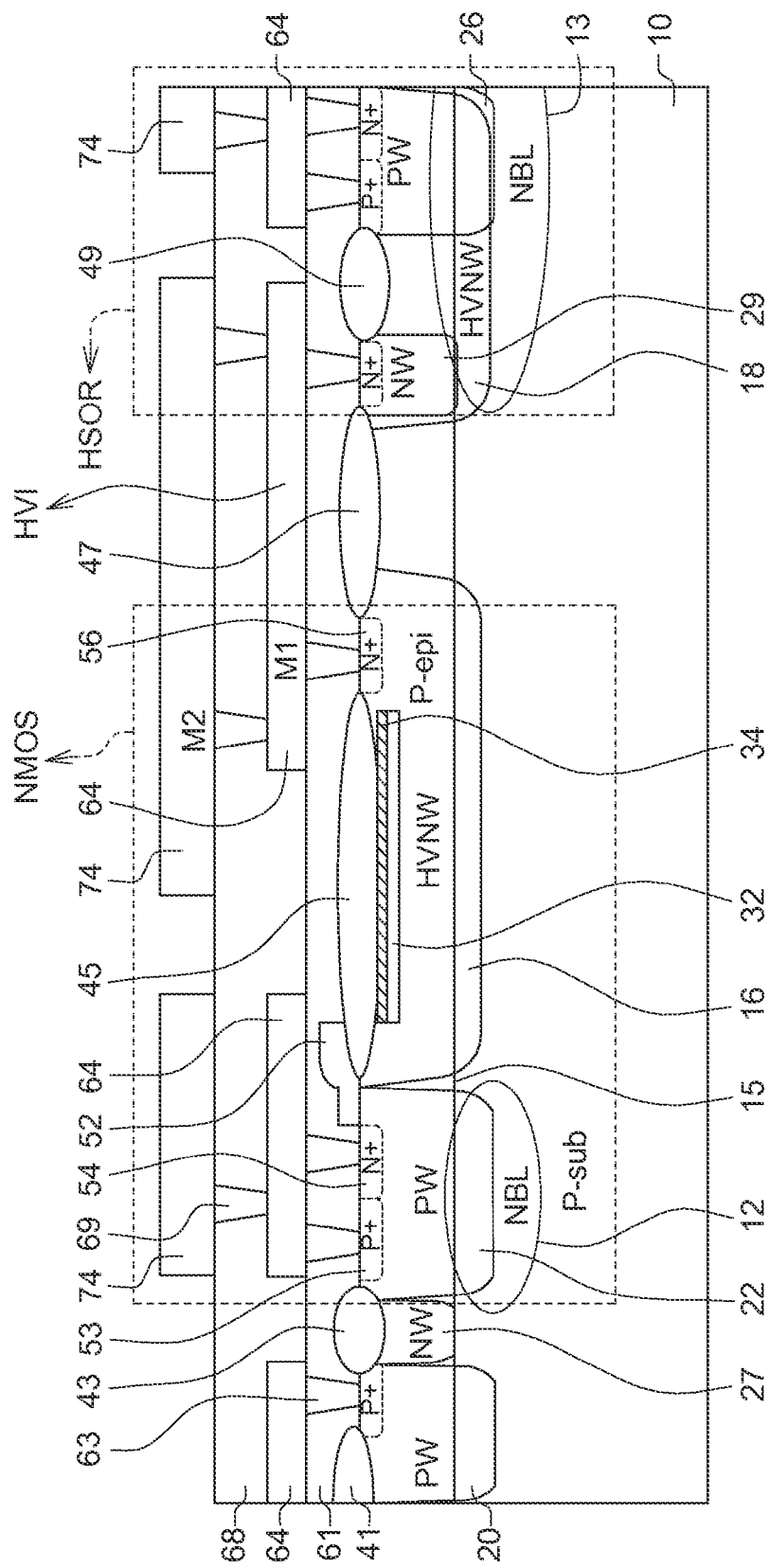
FIG. 9 shows an ultra-high voltage n-type-metal-oxide-semiconductor (UHV NMOS) device according to the sixth embodiment of the present disclosure.

FIG. 9 shows an ultra-high voltage n-type-metal-oxide-semiconductor (UHV NMOS) device according to the sixth embodiment of the present disclosure. In the sixth embodiment, the P-wells in the PW space (PWS) for high voltage interconnection could be removed optionally. Please refer to FIG. 1 and FIG. 9 together. The devices of FIG. 9 and FIG. 1 are identical, except the PWs 241 and 242 at high voltage interconnection region are removed while the self-shielding for HVI is adequate, and not shown in the device of FIG. 9.

UHV NMOS Device of Seventh Embodiment

Figure 10:
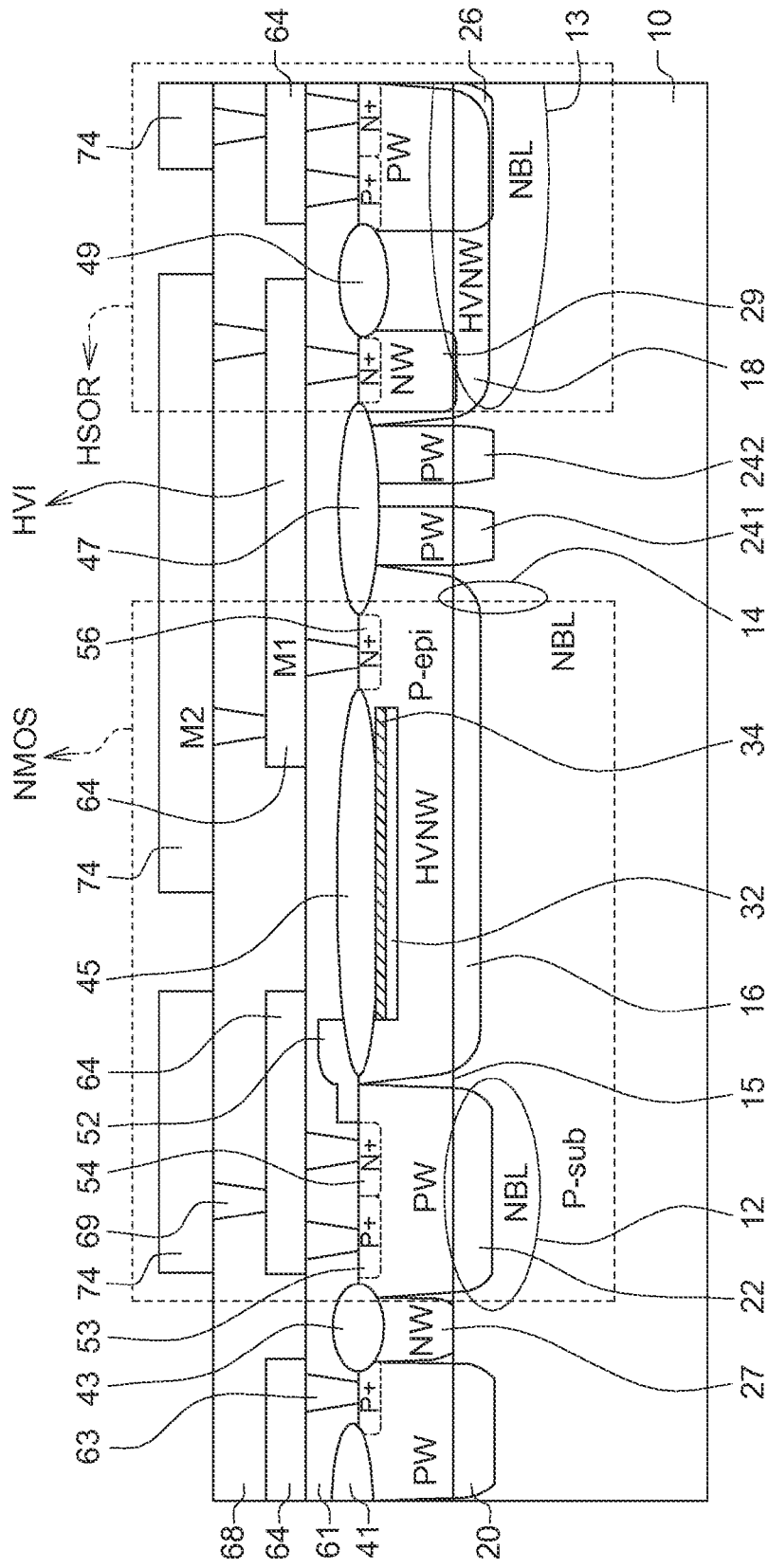
FIG. 10 shows an ultra-high voltage n-type-metal-oxide-semiconductor (UHV NMOS) device according to the seventh embodiment of the present disclosure.

FIG. 10 shows an ultra-high voltage n-type-metal-oxide-semiconductor (UHV NMOS) device according to the seventh embodiment of the present disclosure. In the seventh embodiment, one or more N-doped buried layer (NBL) could be optionally added into the device in order to improve the isolation. Please refer to FIG. 1 and FIG. 10 together. The device of FIG. 10 further includes a third NBL 14 added between the drain 56 and the PW space (i.e. between the drain 56 and the PWs 241 and 242).

UHV NMOS Device of Eighth Embodiment

Figure 11:
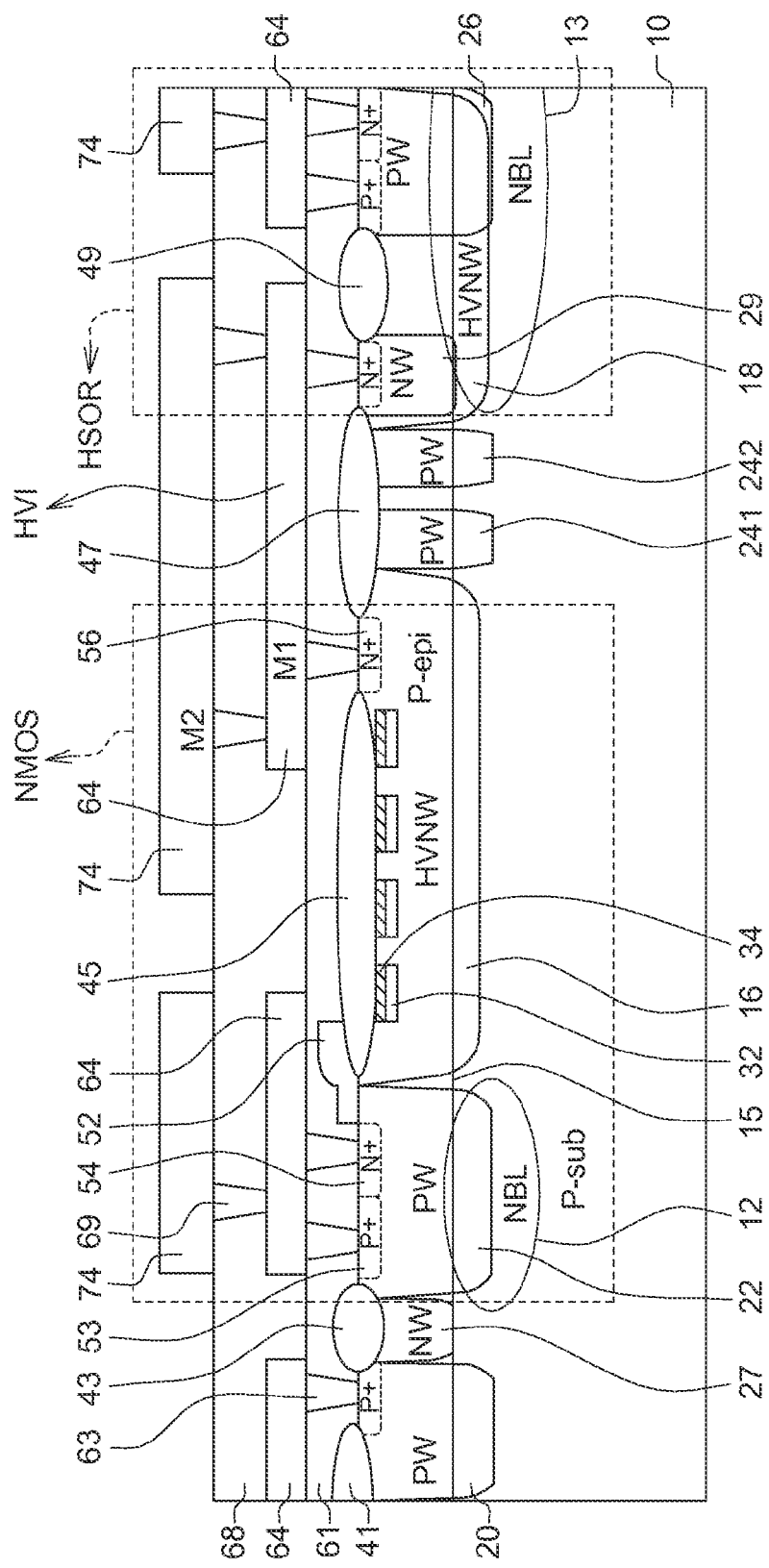
FIG. 11 shows an ultra-high voltage n-type-metal-oxide-semiconductor (UHV NMOS) device according to the eighth embodiment of the present disclosure.

FIG. 11 shows an ultra-high voltage n-type-metal-oxide-semiconductor (UHV NMOS) device according to the eighth embodiment of the present disclosure. In the first embodiment, the P-Top layer 32 and the n-type implant layer 34 formed within the first HVNW region 16 are constructed as an integrated piece. However, the disclosure is not ted thereto. In the eighth embodiment, the P-Top layer 32 and the n-type implant layer 34 could be split into several independent pieces, as shown in FIG. 11.

UHV NMOS Device of Ninth Embodiment

Figure 12:
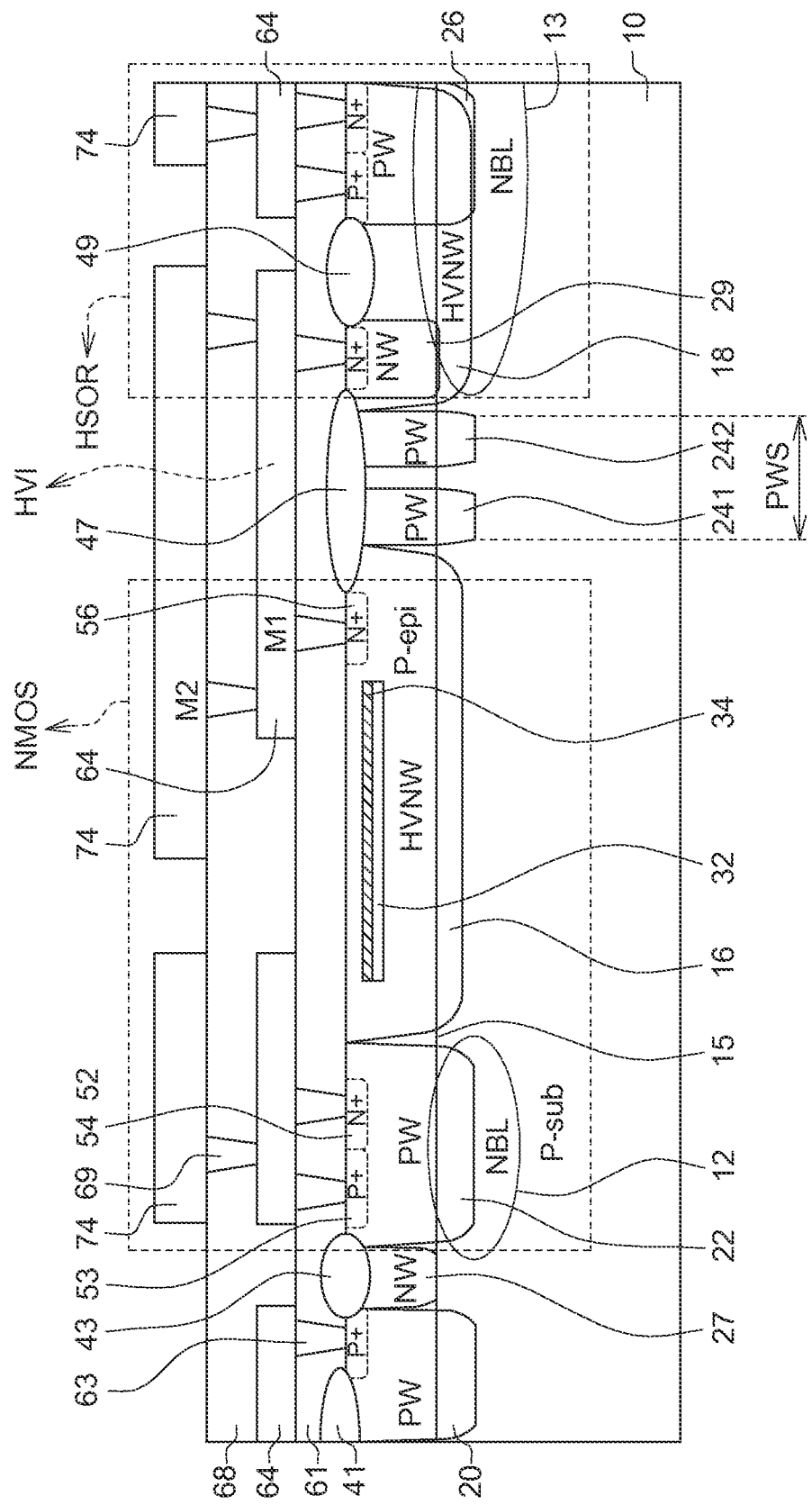
FIG. 12 shows an ultra-high voltage n-type-metal-oxide-semiconductor (UHV NMOS) device according to the ninth embodiment of the present disclosure.

FIG. 12 shows an ultra-high voltage n-type-metal-oxide-semiconductor (UHV NMOS) device according to the ninth embodiment of the present disclosure. In the first embodiment, the device includes the first FOX 41, the second FOX 43, the third FOX 45, the fourth FOX 47 and the fifth FOX 49. However, the disclosure is not limited thereto. Please refer to FIG. 1 and FIG. 12 together. The third FOX 45 of FIG. 1, which is disposed at the first HVNW region 16 and on the n-type implant layer 34 (i.e. the drift region), is removed in the ninth embodiment and not shown in the device of FIG. 12, in order to provide different applications.

UHV NMOS Device of Tenth Embodiment

Figure 13:
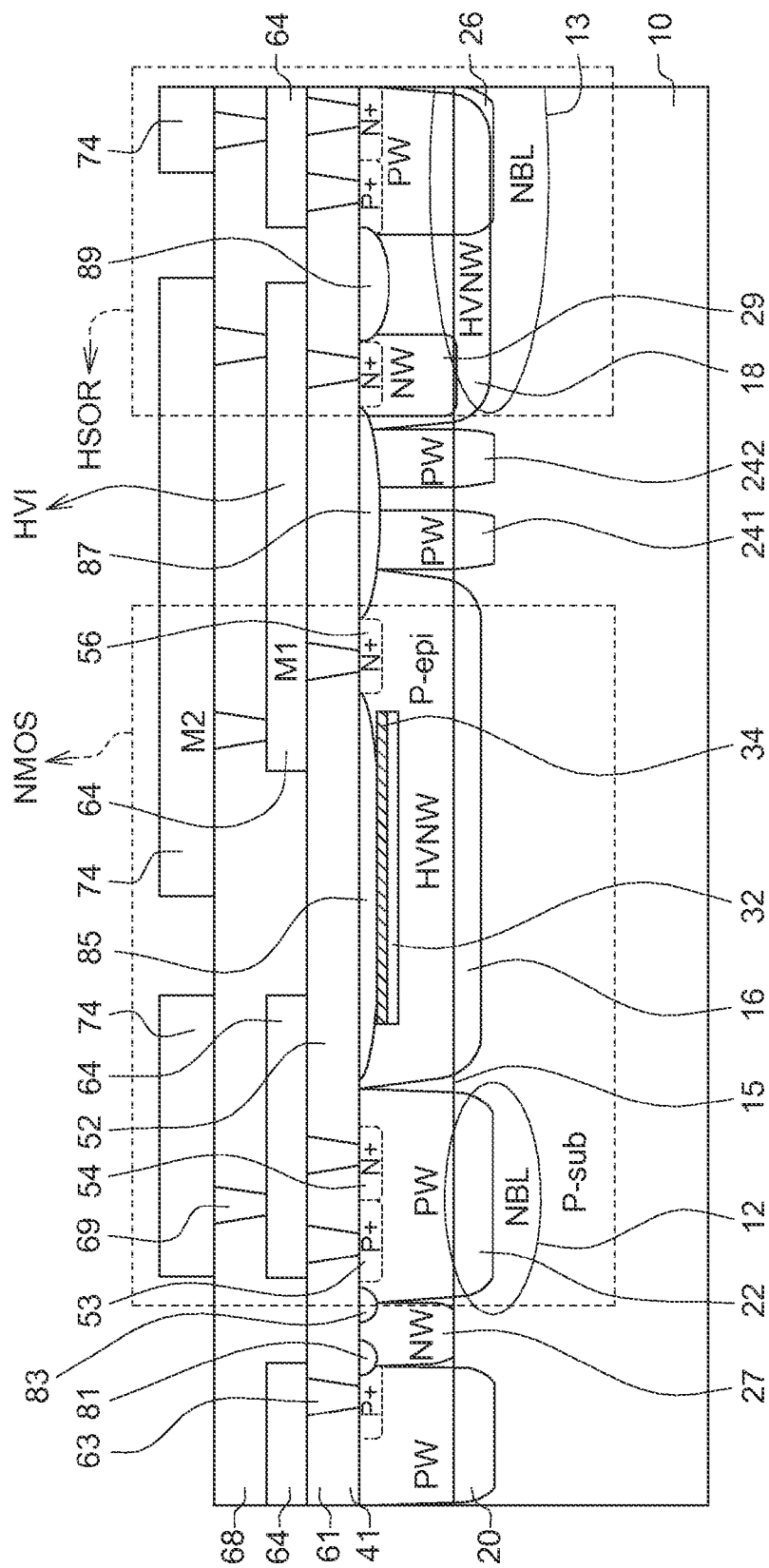
FIG. 13 shows an ultra-high voltage n-type-metal-oxide-semiconductor (UHV NMOS) device according to the tenth embodiment of the present disclosure.

FIG. 13 shows an ultra-high voltage n-type-metal-oxide-semiconductor (UHV NMOS) device according to the tenth embodiment t of the present disclosure. Thermal grown oxide is mainly used as isolation material in semiconductor fabrication. There exist two processes for the isolation of neighboring MOS transistors, namely Local Oxidation of Silicon (LOCOS) process and Shallow Trench Isolation (STI) process. In the first embodiment, the device as shown in FIG. 1 is manufactured by the LOCOS process, and the thick silicon oxide called field oxides (41, 43, 45, 47 and 49) are grown for isolation. The advantages of LOCOS fabrication are the simple process flow and the high oxide quality, because the whole LOCOS structure is thermally grown. However, LOCOS process has the main drawback so-called "bird's beak" effect. To completely avoid the bird's beak shape characteristic, the device of the tenth embodiment can be fabricated by STI process. In the tenth embodiment, the device can be fabricated by STI process. With its zero oxide field encroachment STI is more suitable for the increased density requirements, because it allows to form smaller isolation regions. Thus, the thick first, second, third, fourth and fifth field oxides 41, 43, 45, 47 and 49 of FIG. 1 are replaced by the first, second, third, fourth and fifth isolated oxides 81, 83, 85, 87 and 89 as shown in FIG. 13.

UHV NMOS Device of Eleventh Embodiment

Figure 14:
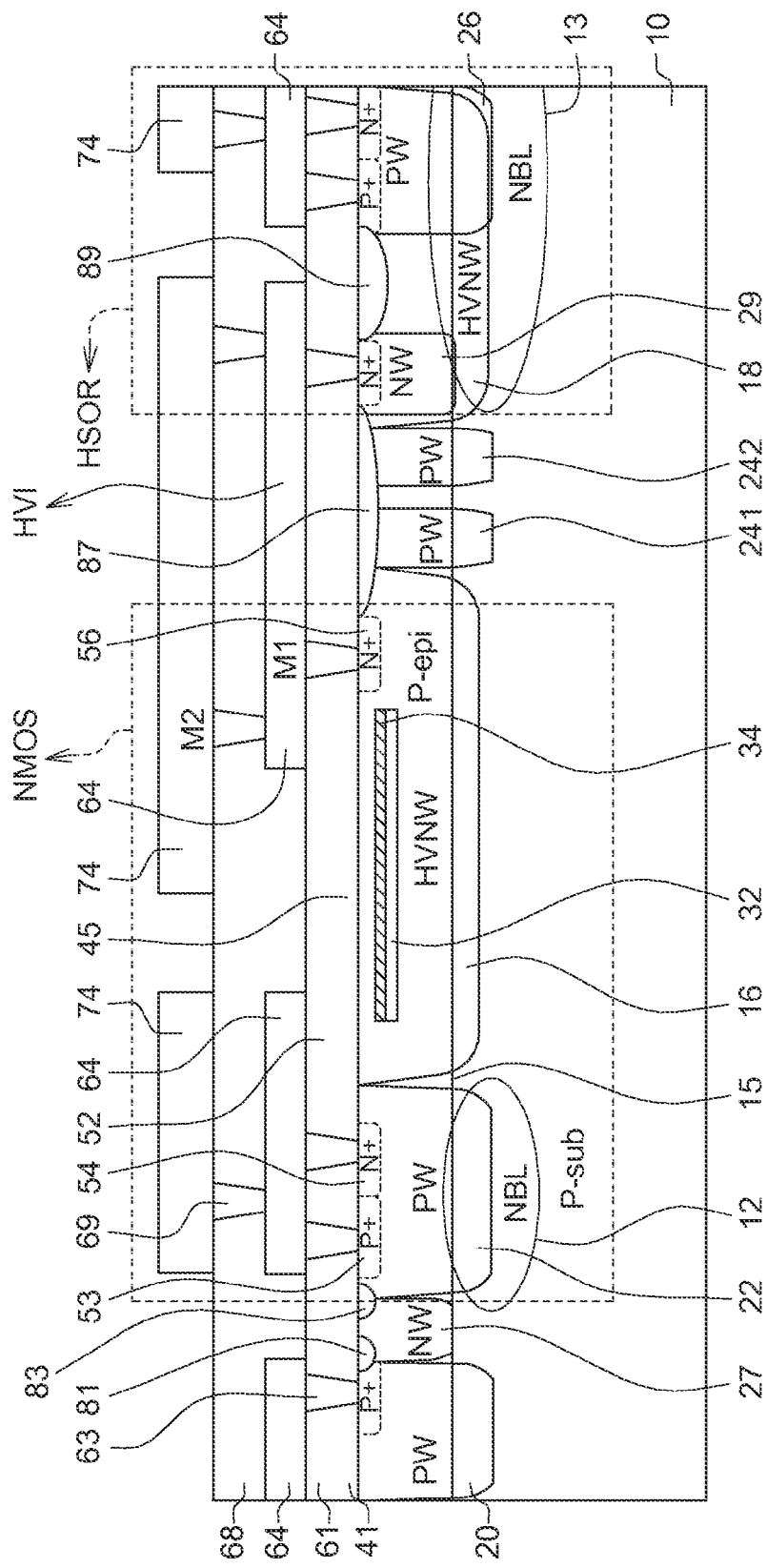
FIG. 14 shows an ultra-high voltage n-type-metal-oxide-semiconductor (UHV NMOS) device according to the eleventh embodiment of the present disclosure.

FIG. 14 shows an ultra-high voltage n-type-metal-oxide-semiconductor (UHV NMOS) device according to the eleventh embodiment of the present disclosure. In the tenth embodiment, the device includes the first isolated oxide 81, the second isolated oxide 83, the third isolated oxide 85, the fourth isolated oxide 87 and the fifth isolated oxide 89. However, the disclosure is not limited thereto. Please refer to FIG. 13 and FIG. 14 together. The third isolated oxide 85 of FIG. 13, which is disposed at the first HVNW region 16 and on the n-type implant layer 34 (i.e. the drift region), can be removed in the eleventh embodiment and not shown in the device of FIG. 14, in order to provide different applications.

UHV NMOS Device of Twelfth Embodiment

Figure 15:
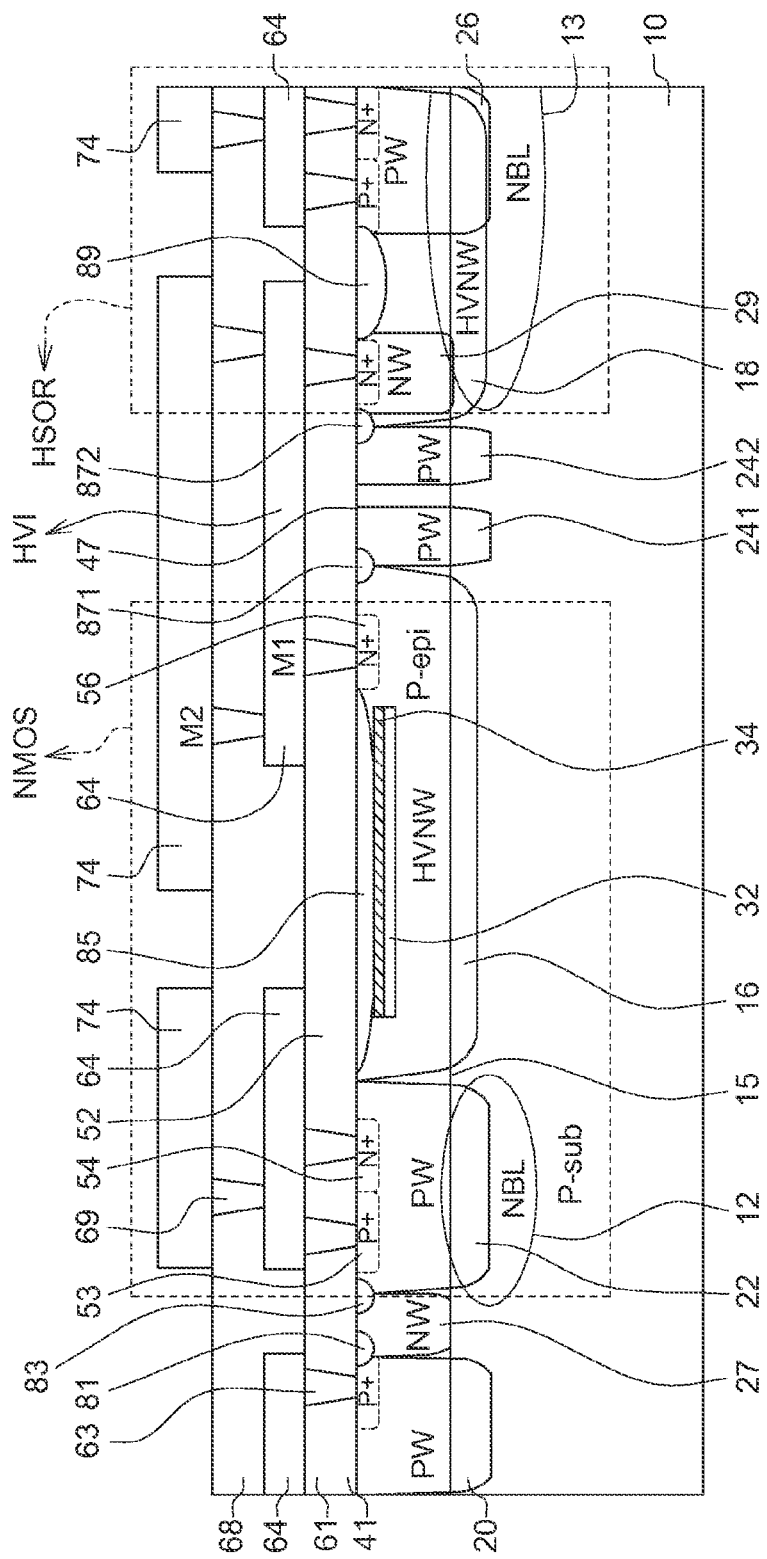
FIG. 15 shows an ultra-high voltage n-type-metal-oxide-semiconductor (UHV NMOS) device according to the twelfth embodiment of the present disclosure.

FIG. 15 shows an ultra-high voltage n-type-metal-oxide-semiconductor (UHV NMOS) device according to the twelfth embodiment of the present disclosure. In the tenth embodiment, the device includes the first isolated oxide 81, the second isolated oxide 83, the third isolated oxide 85, the fourth isolated oxide 87 and the fifth isolated oxide 89, wherein the fourth isolated oxide 87 in the PW space (PWS) is an integrated piece. However, the disclosure is not limited thereto. Please refer to FIG. 13 and FIG. 15 together. In the twelfth embodiment, the PW space (PWS) may include two isolated oxides 871 and 872 spaced apart from each other to provide PW shielding.

UHV NMOS Device of Thirteenth Embodiment

Figure 16:
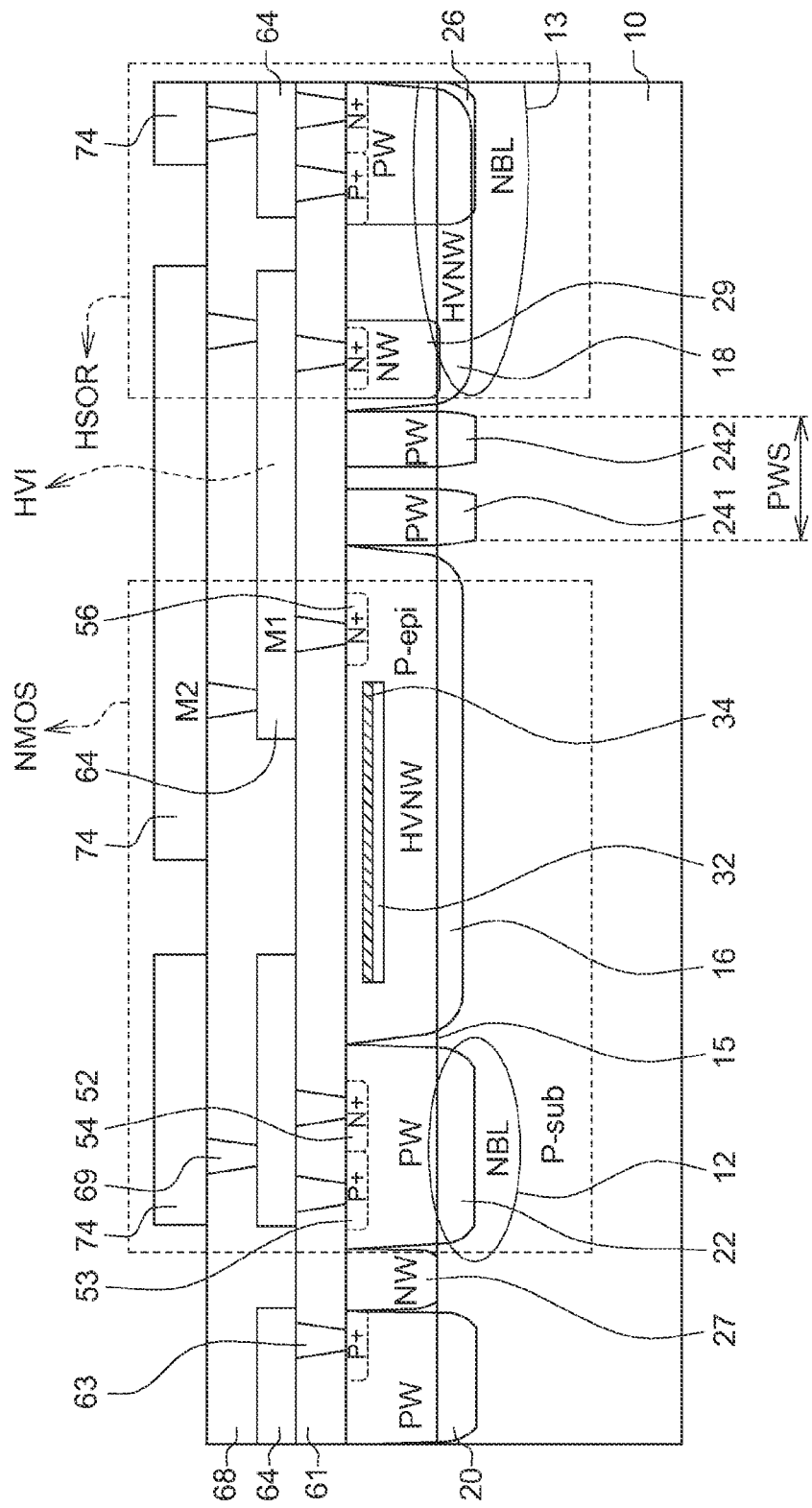
FIG. 16 shows an ultra-high voltage n-type-metal-oxide-semiconductor (UHV NMOS) device according to the thirteenth embodiment of the present disclosure.

FIG. 16 shows an ultra-high voltage n-type-metal-oxide-semiconductor (UHV NMOS) device according to the thirteenth embodiment of the present disclosure. In the first embodiment, the device fabricated by LOCOS process includes the first, second, third, fourth and fifth field oxides 41, 43, 45, 47 and 49. In the tenth embodiment, the device fabricated by STI process includes the first, second, third, fourth and fifth isolated oxides 81, 83, 85, 87 and 89. However, the disclosure is not limited to those processes. In some cases (for example, the cost considerations), the device could be fabricated without using LOCOS and STI processes, and not any of field oxides and isolated oxides shown in FIG. 16 according to the thirteenth embodiment.

UHV NMOS Device of Fourteenth Embodiment

Figure 17:
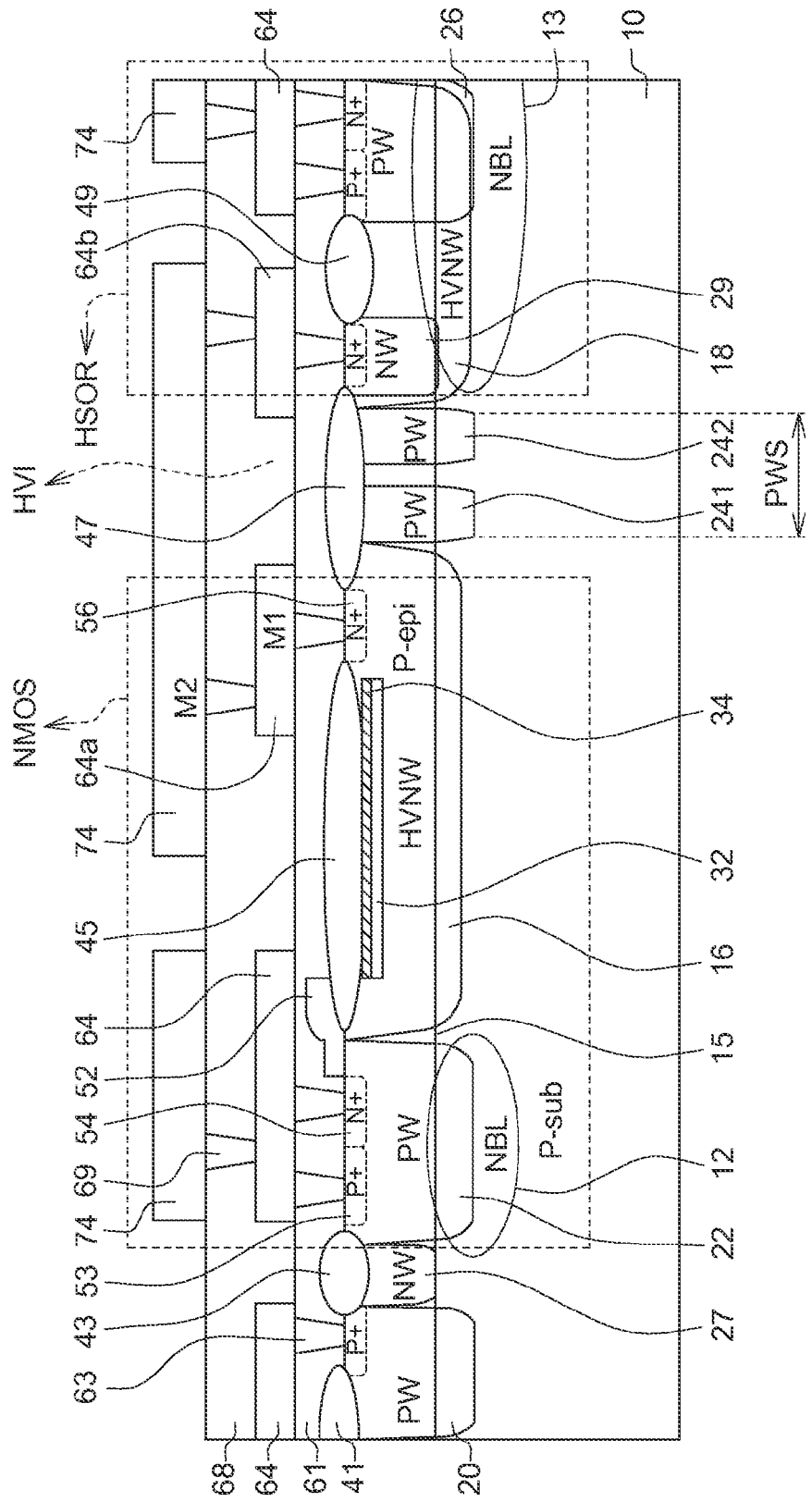
FIG. 17 shows an ultra-high voltage n-type-metal-oxide-semiconductor (UHV NMOS) device according to the fourteenth embodiment of the present disclosure.

FIG. 17 shows an ultra-high voltage n-type-metal-oxide-semiconductor (UHV NMOS) device according to the fourteenth embodiment of the present disclosure. Please refer to FIG. 1 and FIG. 17 together. In the first embodiment, a portion of the first patterned metal layer 64 and a portion of the second patterned metal layer 74 overpass the PW space (PWS) for high-voltage interconnection. However, the disclosure is not limited thereto. In the fourteenth embodiment, it is also applicable that only a portion of the second patterned metal layer 74 overpass the PW space (PWS) for high-voltage interconnection, while the first patterned metal layer 64 includes the discrete parts 64a and 64b setting without over-passing the PW space, as shown in FIG. 17.

UHV NMOS Device of Fifteenth Embodiment

Figure 18:
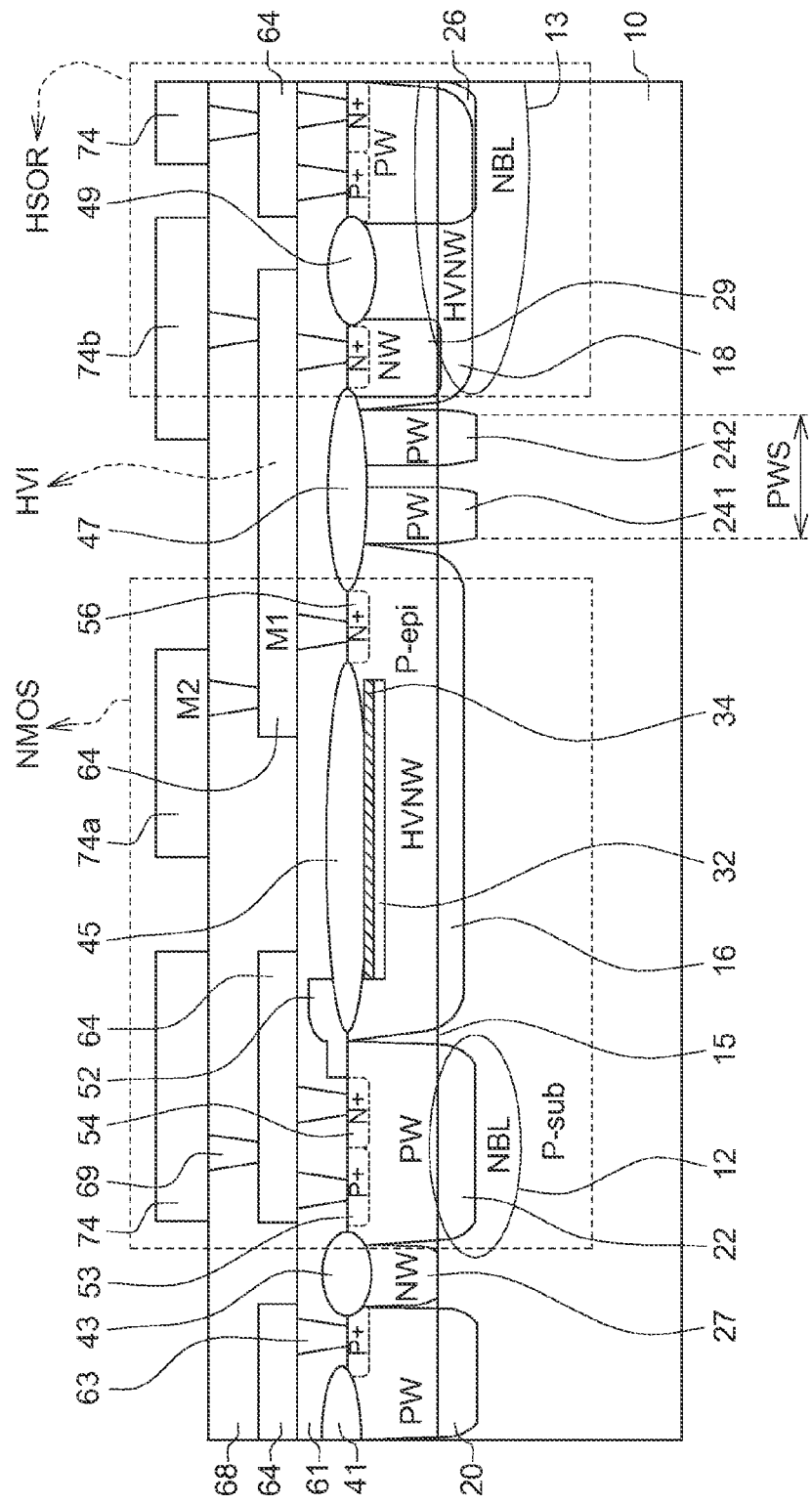
FIG. 18 shows an ultra-high voltage n-type-metal-oxide-semiconductor (UHV NMOS) device according to the fifteenth embodiment of the present disclosure.

FIG. 18 shows an ultra-high voltage n-type-metal-oxide-semiconductor (UHV NMOS) device according to the fifteenth embodiment of the present disclosure. Please refer to FIG. 1 and FIG. 18 together. In the first embodiment, a portion of the first patterned metal layer 64 and a portion of the second patterned metal layer 74 all overpass the PW space (PWS) for high-voltage interconnection. However, the disclosure is not limited thereto. In the fifteenth embodiment, it is also applicable that only a portion of the first patterned metal layer 64 overpass the PW space (PWS) for high-voltage interconnection, while the second patterned metal layer 74 includes the discrete parts 74a and 74b setting without over-passing the PW space, as shown in FIG. 18.

UHV NMOS Device of Sixteenth Embodiment

Figure 19:
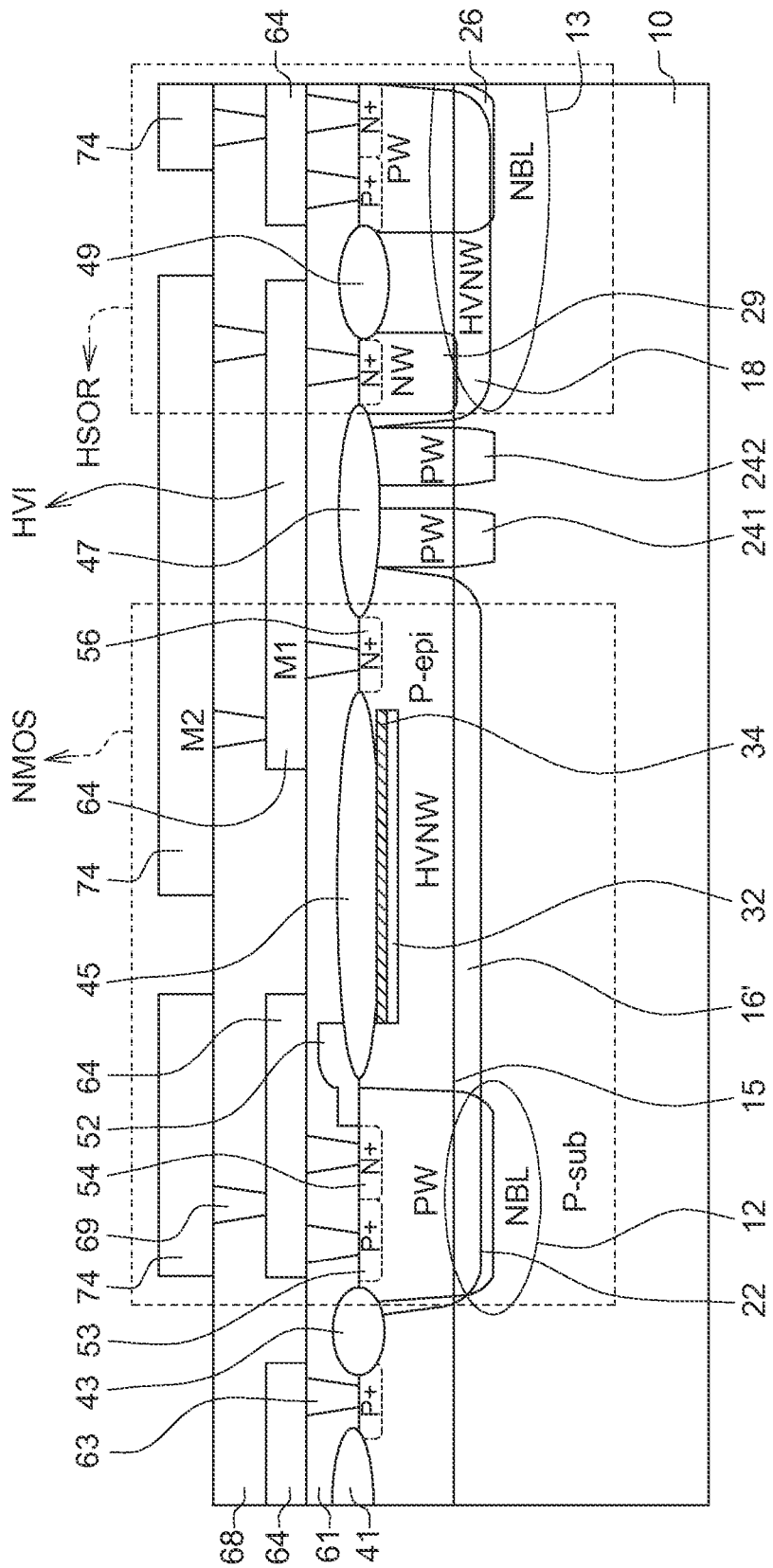
FIG. 19 shows an ultra-high voltage n-type-metal-oxide-semiconductor (UHV NMOS) device according to the sixteen embodiment of the present disclosure.

FIG. 19 shows an ultra-high voltage n-type-metal-oxide-semiconductor (UHV NMOS) device according to the sixteen embodiment of the present disclosure. Please refer to FIG. 1 and FIG. 19 together. In the first embodiment, the first HVNW region 16 is positioned between the bulk and source P-well 22 and the PW 241. However, the disclosure is not limited thereto. In the sixteenth embodiment, the first HVNW region 16' may extend to the source and bulk PW 22 for the alternative applications.

UHV NMOS Device of Seventeenth Embodiment

Figure 20:
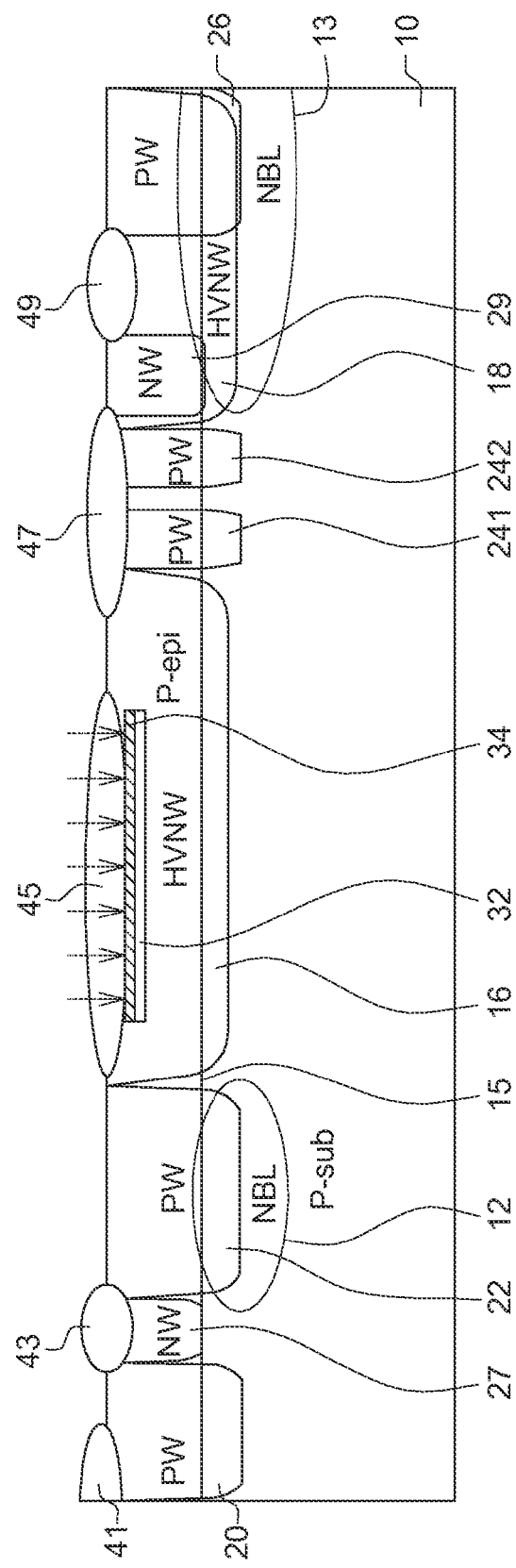
FIG. 20 shows an alternative procedure for fabricating an ultra-high voltage n-type-metal-oxide-semiconductor (UHV NMOS) device according to the seventeenth embodiment of the present disclosure.

FIG. 20 shows an alternative procedure for fabricating an ultra-high voltage n-type-metal-oxide-semiconductor (UHV NMOS) device according to the seventeenth embodiment of the present disclosure. Please refer to FIG. 3C, FIG. 3D and FIG. 20 together. In the procedures of fabricating the device of the first embodiment, the P-Top layer 32 and the n-type implant layer 34 are formed before growing the FOX, as shown in FIG. 3C to FIG. 3D. However, the disclosure is not limited thereto. In some cases, the P-Top layer 32 and the n-type implant layer 34 could be formed after growing the FOX as illustrated in the seventeenth embodiment, wherein the implantation of the P-Top layer 32 and the n-type implant layer 34 could be set up through the third FOX 45 for disposing underneath the third FOX 45, as shown in FIG. 20.

Many modifications and other embodiments of the disclosure set forth herein will come to mind to one skilled in the art to which these disclosure pertain having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of imitation.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing ultra-high voltage n-type-metal-oxide-semiconductor (UHV NMOS) device, at least comprising:
   providing a substrate of P-type material;
   forming a first high-voltage N-well (HVNW) region in a portion of the substrate;
   forming a second HVNW region in another portion of the substrate, wherein the second HVNW region is disposed at a high-side operation region of the substrate;
   forming at least two p-wells (PWs) separately in a region for PWs, the region for PWs adjacent to the first and second HVNW regions;
   forming a source and bulk p-well (PW) adjacent to one side of the first HVNW region;
   forming a P-Top layer within the first HVNW region; and
   forming an n-type implant layer on the P-Top layer.

2. The method according to claim 1, wherein the P-Top layer and the n-type implant layer are formed by ion implant or doping.

3. The method according to claim 1, further comprising:
   forming a source and a bulk in the source and bulk PW;
   forming a gate extended from the source and bulk PW to a portion of the first HVNW region; and
   forming a drain within another portion of the first HVNW region that is opposite to the gate, wherein the P-Top layer and the n-type implant layer are positioned between the drain and the source and bulk PW.

4. The method according to claim 3, further comprising growing a field oxide (FOX) at the first HVNW region and on the n-type implant layer, wherein the gate is extended from the source and bulk PW to a portion of the FOX.

5. The method according to claim 3, further comprising growing a field oxide (FOX) at the first HVNW region, and the P-Top layer and the n-type implant layer formed under the FOX after growing the FOX, wherein the gate is extended from the source and bulk PW to a portion of the FOX.

6. The method according to claim 1, further comprising:
   forming an inter-layer dielectric (ILD) layer on the substrate; and
   forming a first patterned metal layer on the ILD layer, and a portion of the first patterned metal layer over-passing the region for PWs for high-voltage interconnection.

7. The method according to claim 6, further comprising
   forming an inter-metal dielectric (IMD) layer on the first patterned metal layer; and
   forming a second patterned metal layer on the IMD layer, wherein at least one portion of the first and second patterned metal layers overpass the region for PWs for high-voltage interconnection.

8. The method according to claim 1, further comprising forming a first N-doped buried layer (NBL) adjacent to the first HVNW region and under the source and bulk PW.

9. The method according to claim 8, further comprising forming a second N-doped buried layer (NBL) adjacent to the second HVNW region in the high-side operation region.

10. The method according to claim 9, further comprising:
    a third N-doped buried layer (NBL) disposed between the drain and the region for PWs.

11. The method according to claim 1, wherein the n-type implant layer and P-Top layer beneath are formed as plural split blocks within the first HVNW region.

* * * * *